United States Patent [19]
Oie et al.

[11] Patent Number: 5,773,190
[45] Date of Patent: Jun. 30, 1998

[54] RESIST COMPOSITION

[75] Inventors: Masayuki Oie; Hideyuki Tanaka; Nobunori Abe, all of Yokohama, Japan

[73] Assignee: Nippon Zeon Co., Ltd., Tokyo, Japan

[21] Appl. No.: 795,266

[22] Filed: Feb. 10, 1997

Related U.S. Application Data

[63] Continuation of Ser. No. 636,201, Apr. 22, 1996, abandoned, which is a continuation of Ser. No. 304,971, Sep. 13, 1994, abandoned, which is a continuation of Ser. No. 895,976, Jun. 9, 1992, abandoned.

[30] Foreign Application Priority Data

Jun. 14, 1991 [JP] Japan .................................. 3-170723
Jul. 2, 1991 [JP] Japan .................................. 3-188138

[51] Int. Cl.$^6$ ..................................................... G03F 7/00
[52] U.S. Cl. ..................... 430/270.1; 430/916; 430/921; 430/925
[58] Field of Search ................................ 430/270.1, 913, 430/916, 921, 925; 522/34, 45, 56

[56] References Cited

U.S. PATENT DOCUMENTS 5,234,791  8/1993  Dammel et al. ........................ 430/270

FOREIGN PATENT DOCUMENTS 0232972   1/1987  European Pat. Off. .
0349803 A  6/1989  European Pat. Off. .
0401499   4/1990  European Pat. Off. .
2-52348   2/1990  Japan .

*Primary Examiner*—Kathleen Duda
*Attorney, Agent, or Firm*—McDermott, Will & Emery

[57] ABSTRACT

Disclosed herein is a resist composition comprising in admixture (a) 100 parts by weight of an alkali-soluble phenolic resin, (b) 0.2–50 parts by weight of a compound which forms an acid upon exposure to active rays and consists of a specific halogen-containing aromatic compound, (c) 0.01–50 parts by weight of a compound which crosslinks the alkali-soluble phenolic resin in the presence of the acid formed from the compound (b), and (d) sufficient solvent to dissolve the foregoing composition components.

7 Claims, No Drawings

RESIST COMPOSITION

This application is a continuation of application Ser. No. 08/636,201 filed Apr. 22, 1996, now abandoned which is a continuation of application Ser. No. 08/304,971 filed Sep. 13, 1994, which is a continuation of application Ser. No. 07/895,976, filed Jun. 9, 1992, both abandoned.

FIELD OF THE INVENTION

The present invention relates to a resist composition, and more specifically to a resist material permitting formation of patterns by irradiation of far ultraviolet radiation, KrF excimer laser beam or the like. The resist composition according to this invention is particularly suitable for use as a negative resist for minute processing of semiconductor elements.

BACKGROUND OF THE INVENTION

Upon fabrication of a semiconductor device by minute processing making use of a resist, an image (pattern) is obtained by a lithography technique in which the resist is applied onto the surface of a silicon wafer to form a photosensitive film, the film is exposed to light so as to form a latent image and the latent image is then developed to form a negative or positive image. After etching the silicon wafer using, as a protective film, the resist remaining on the silicon wafer, the resist film is removed, thereby completing the minute processing.

With the high integration, high density assembly and miniaturization of semiconductor elements toward IC, LSI and further VLSI, there has been a demand for a technique forming a minute pattern having a line width of 1 $\mu$m or less in recent years. It is however extremely difficult to form any minute patterns of 1 $\mu$m or less in line width with precision by the conventional lithography technique making use of near ultraviolet radiation or visible radiation. Their yields are also lowered to a significant extent.

Therefore, in order to enhance the resolution of exposure, there have been studied other lithography techniques making use of far ultraviolet radiation (short wavelength ultraviolet radiation), KrF excimer laser beam (radiation having a wavelength of 248 nm, which is emitted by a krypton fluoride laser) or the like, which has a shorter wavelength, instead of the conventional lithography technique utilizing light (ultraviolet radiation having a wavelength of 350–450 nm). The resist material, which is central to such lithography techniques, is required to have a number of high properties. Among these properties, sensitivity, resolution, resistance to etching and storage stability are particularly important.

However, resist materials developed heretofore do not sufficiently satisfy the performance of all these properties. There has hence been a strong demand for enhancement of the performance of such properties.

For example, a negative resist such as polyglycidyl methacrylate is high in sensitivity, but poor in resolution and resistance to dry etching. On the other hand, a positive resist such as polymethyl methacrylate is good in resolution, but poor in sensitivity and resistance to dry etching.

Resists for minute processing, which are composed of a three component system of a base polymer, a photo-induced acid generator (a compound which forms an acid upon exposure to active rays) and an acid-sensitive substance (a compound which crosslinks the base polymer in the presence of an acid), have recently been developed. These serve as a positive or negative resist by a reaction of the acid-sensitive substance in the presence of an acid as a catalyst, which has been generated by action of light, thereby changing the solubility and the like of the base polymer. For example, a negative resist composed of a novolak resin, methylol melamine and a photo-induced acid generator is known. Methylol melamine crosslinks the phenolic novolak resin in the presence of an acid as a catalyst, which has been generated by action of light, to insolubulize the novolak resin. In addition, there is also known a negative resist making use of a phenomenon in which a polymer such as a novolak-epoxy compound containing cation-polymerizing functional groups is exposed to light in the presence of a photo-induced acid generator to form a crosslinked structure by a reaction of the functional groups, thereby insolubilize the polymer.

However, when a photoresist of the novolak type is exposed to far ultraviolet radiation, the sensitivity and resolution of the photoresist become insufficient due to the fact that the resist itself absorbs the far ultraviolet radiation to a great extent, whereby a good minute pattern cannot be formed. Therefore, such resists are still insufficient in view of a recent higher standard of performance requirements.

There has recently been proposed a negative resist making use, as a compound which forms an acid upon exposure to high-energy radiation, of a compound having one or more chlorine or bromine atoms bonded to aromatic carbon atoms, such as tetrabromobisphenol A (Japanese Patent Application Laid-Open No. 52348/1990). However, the sensitivity of this resist is still insufficient. Further, this acid-forming compound is insufficient in compatibility with alkali-soluble phenolic resins. The resulting resist is also far from being satisfactory in both solubility in solvents and storage stability.

There has hence been a strong demand for developing a novel resist having performance well balanced among the above-mentioned properties.

OBJECTS AND SUMMARY OF THE INVENTION

It is an object of this invention to provide a resist material in which the resist properties such as sensitivity, resolution, resistance to etching and storage stability are highly balanced.

Another object of this invention is to provide a resist material suitable for use in lithography making use of far ultraviolet radiation or KrF excimer laser beam, which is short in wavelength.

A further object of this invention is to provide a resist composition suitable for use as a negative resist for minute processing of semiconductor elements.

The present inventors have carried out an extensive investigation with a view toward solving the above-described problems involved in the prior art. As a result, it has been found that in a resist composition comprising an alkali-soluble phenolic resin, a compound which forms an acid upon exposure to active rays and a compound which crosslinks the alkali-soluble phenolic resin in the presence of an acid, when an aromatic compound having, as a substituent group, a halogenated alkoxy group such as a chlorinated alkoxy group or a brominated alkoxy group, or a specific halogen-containing polyhydric phenolic compound having at least one halogen atom as a substituent on its ring is used as the compound which forms an acid upon exposure to active rays, the resist composition can be provided as a composition excellent in sensitivity, resolution, resistance to etching, storage stability, etc. This resist is particularly suitable for use as a negative resist for minute processing of semiconductor elements.

The present invention has been led to completion on the basis of this finding.

According to the present invention, there is thus provided a resist composition comprising in admixture:

(a) 100 parts by weight of an alkali-soluble phenolic resin;

(b) 0.2–50 parts by weight of at least one compound which forms an acid upon exposure to active rays and is selected from the group consisting of halogen-containing aromatic compounds represented by the following general formulae (1) through (16):

General Formula (1):

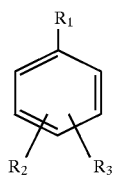

(1)

wherein $R_1$ means a halogenated alkoxy group with the proviso that the halogen atom is selected from chlorine and bromine atoms, and $R_2$ and $R_3$ are independently selected from a hydrogen atom, halogen atoms, a hydroxyl group, alkyl groups, substituted alkyl groups, alkoxy groups, substituted alkoxy groups, a nitro group and amino group;

General Formula (2):

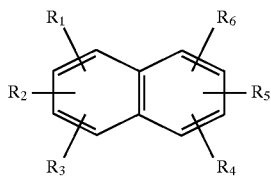

(2)

wherein $R_1$ means a halogenated alkoxy group with the proviso that the halogen atom is selected from chlorine and bromine atoms, and $R_2$ through $R_6$ are independently selected from a hydrogen atom, halogen atoms, a hydroxyl group, alkyl groups, substituted alkyl groups, alkoxy groups and substituted alkoxy groups;

General Formula (3):

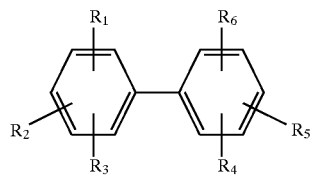

(3)

wherein $R_1$ means a halogenated alkoxy group with the proviso that the halogen atom is selected from chlorine and bromine atoms, and $R_2$ through $R_6$ are independently selected from a hydrogen atom, halogen atoms, a hydroxyl group, alkyl groups, substituted alkyl groups, alkoxy groups and substituted alkoxy groups;

General Formula (4):

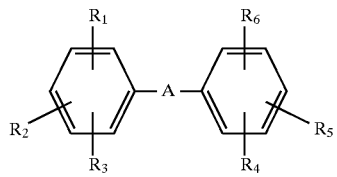

(4)

wherein $R_1$ means a halogenated alkoxy group with the proviso that the halogen atom is selected from chlorine and bromine atoms, $R_2$ through $R_6$ are independently selected from a hydrogen atom, halogen atoms, a hydroxyl group, alkyl groups, substituted alkyl groups, alkoxy groups and substituted alkoxy groups, and A denotes

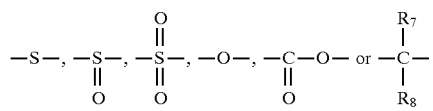

in which $R_7$ and $R_8$ are independently selected from a hydrogen atom, alkyl groups, cycloalkyl groups and alkenyl groups;

General Formula (5):

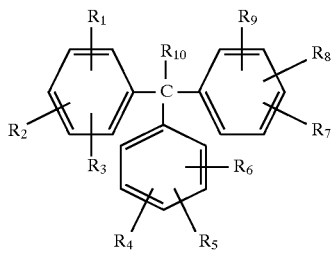

(5)

wherein $R_1$ means a halogenated alkoxy group with the proviso that the halogen atom is selected from chlorine and bromine atoms, $R_2$ through $R_9$ are independently selected from a hydrogen atom, halogen atoms, a hydroxyl group, alkyl groups, substituted alkyl groups, alkoxy groups and substituted alkoxy groups, and $R_{10}$ denotes a hydrogen atom or an alkyl group;

General Formula (6):

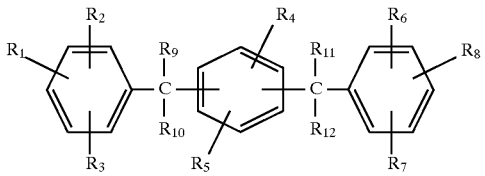

(6)

wherein $R_1$ means a halogenated alkoxy group with the proviso that the halogen atom is selected from chlorine and bromine atoms, $R_2$ through $R_8$ are independently selected from a hydrogen atom, halogen atoms, a hydroxyl group, alkyl groups, substituted alkyl groups, alkoxy groups and substituted alkoxy groups, and $R_9$ through $R_{12}$ are independently selected from a hydrogen atom and alkyl groups;

General Formula (7):

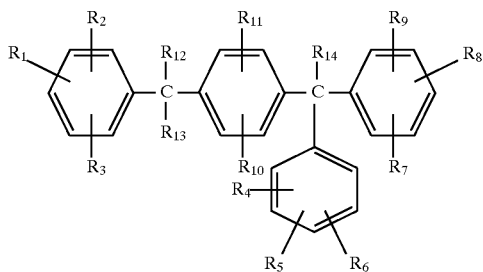

wherein $R_1$ means a halogenated alkoxy group with the proviso that the halogen atom is selected from chlorine and bromine atoms, $R_2$ through $R_9$ are independently selected from a hydrogen atom, halogen atoms, a hydroxyl group, alkyl groups, substituted alkyl groups, alkoxy groups and substituted alkoxy groups, $R_{10}$ and $R_{11}$ are independently selected from a hydrogen atom, halogen atoms and alkyl groups, and $R_{12}$ through $R_{14}$ are independently selected from a hydrogen atom and alkyl groups;

General Formula (8):

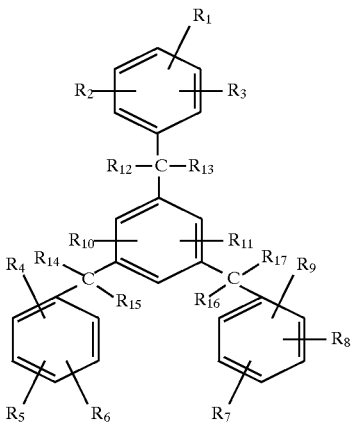

wherein $R_1$ means a halogenated alkoxy group with the proviso that the halogen atom is selected from chlorine and bromine atoms, $R_2$ through $R_9$ are independently selected from a hydrogen atom, halogen atoms, a hydroxyl group, alkyl groups, substituted alkyl groups, alkoxy groups and substituted alkoxy groups, $R_{10}$ and $R_{11}$ are independently selected from a hydrogen atom, halogen atoms and alkyl groups, and $R_{12}$ through $R_{17}$ are independently selected from a hydrogen atom and alkyl groups;

General Formula (9):

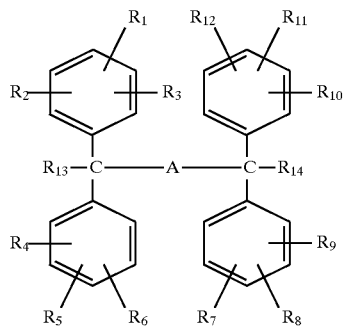

wherein $R_1$ means a halogenated alkoxy group with the proviso that the halogen atom is selected from chlorine and bromine atoms, $R_2$ through $R_{12}$ are independently selected from a hydrogen atom, halogen atoms, a hydroxyl group, alkyl groups, substituted alkyl groups, alkoxy groups and substituted alkoxy groups, $R_{13}$ and $R_{14}$ are independently selected from a hydrogen atom and alkyl groups, and A denotes a single bond, or an alkylene, substituted alkylene, alkenylene, substituted alkenylene, arylene or substituted arylene group;

General Formula (10):

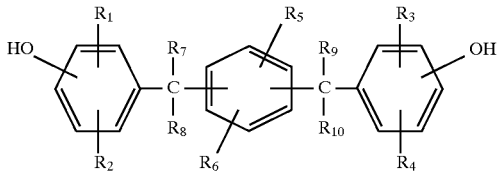

wherein $R_1$ through $R_6$ are independently selected from a hydrogen atom, halogen atoms, a hydroxyl group, alkyl groups, substituted alkyl groups, alkoxy groups and substituted alkoxy groups, with the proviso that at least one of them is a halogen atom, and $R_7$ through $R_{10}$ are independently selected from a hydrogen atom and alkyl groups;

General Formula (11):

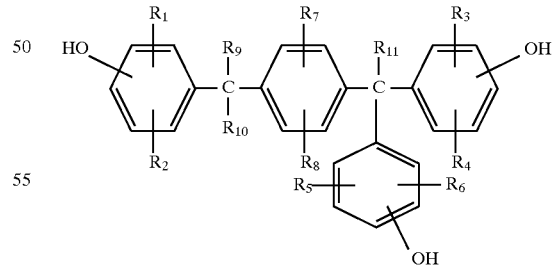

wherein $R_1$ through $R_8$ are independently selected from a hydrogen atom, halogen atoms, a hydroxyl group, alkyl groups, substituted alkyl groups, alkoxy groups and substituted alkoxy groups, with the proviso that at least one of them is a halogen atom, and $R_9$ through $R_{11}$ are independently selected from a hydrogen atom and alkyl groups;

General Formula (12):

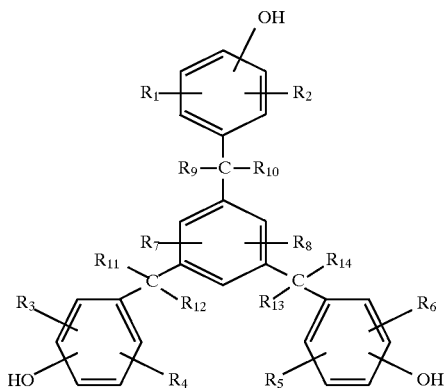

wherein
R$_1$ through R$_8$ are independently selected from a hydrogen atom, halogen atoms, a hydroxyl group, alkyl groups, substituted alkyl groups, alkoxy groups and substituted alkoxy groups, with the proviso that at least one of them is a halogen atom, and
R$_9$ through R$_{14}$ are independently selected from a hydrogen atom and alkyl groups;

General Formula (13):

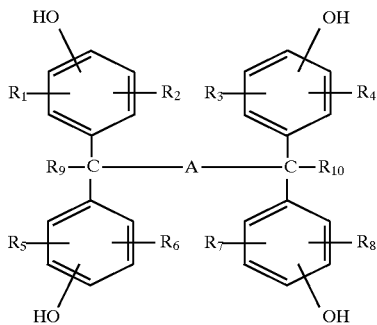

wherein
R$_1$ through R$_8$ are independently selected from a hydrogen atom, halogen atoms, a hydroxyl group, alkyl groups, substituted alkyl groups, alkoxy groups and substituted alkoxy groups, with the proviso that at least one of them is a halogen atom,
R$_9$ and R$_{10}$ are independently selected from a hydrogen atom and alkyl groups, and
A denotes a single bond, or an alkylene, substituted alkylene, alkenylene, substituted alkenylene, arylene or substituted arylene group;

General Formula (14):

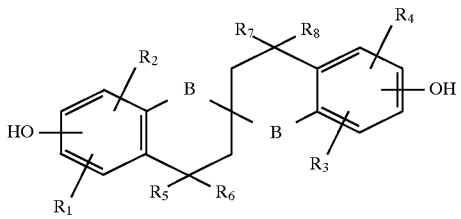

wherein
R$_1$ through R$_4$ are independently selected from a hydrogen atom, halogen atoms, a hydroxyl group, alkyl groups, substituted alkyl groups, alkoxy groups and substituted alkoxy groups, with the proviso that at least one of them is a halogen atom, R$_5$ through R$_8$ are independently selected from a hydrogen atom and alkyl groups, and
B denotes an oxygen atom or a single bond;

General Formula (15):

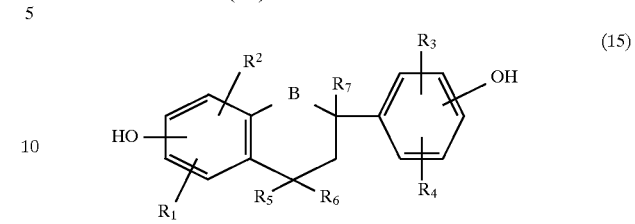

wherein
R$_1$ through R$_4$ are independently selected from a hydrogen atom, halogen atoms, a hydroxyl group, alkyl groups, substituted alkyl groups, alkoxy groups and substituted alkoxy groups, with the proviso that at least one of them is a halogen atom,
R$_5$ through R$_7$ are independently selected from a hydrogen atom and alkyl groups, and
B denotes an oxygen atom or a single bond; and General Formula (16):

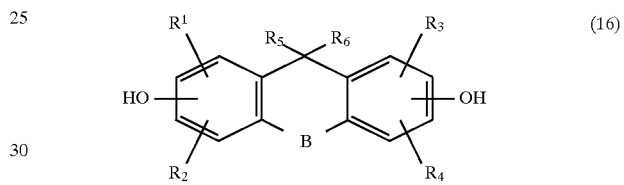

wherein
R$_1$ through R$_4$ are independently selected from a hydrogen atom, halogen atoms, a hydroxyl group, alkyl groups, substituted alkyl groups, alkoxy groups and substituted alkoxy groups, with the proviso that at least one of them is a halogen atom,
R$_5$ through R$_6$ are independently selected from a hydrogen atom and alkyl groups, and
B denotes an oxygen atom or a single bond;
(c) 0.01–50 parts by weight of a compound which crosslinks the alkali-soluble phenolic resin in the presence of the acid formed from the compound (b); and
(d) sufficient solvent to dissolve the foregoing composition components.

DETAILED DESCRIPTION OF THE INVENTION

The features of the present invention will hereinafter be described in detail.

(Alkali-soluble phenolic resin)

As exemplary alkali-soluble phenolic resins useful in the practice of this invention, may be mentioned condensation products of a phenol and an aldehyde, condensation products of a phenol and a ketone, vinylphenol polymers, isopropenylphenol polymers and hydrogenation products of these phenolic resins.

As specific examples of the phenols usable herein, may be mentioned monohydric phenols such as phenol, cresol, xylenol, ethylphenol, propylphenol, butylphenol and phenylphenol; and polyhydric phenols such as resorcinol, pyrocatechol, hydroquione, bisphenol A and pyrogallol.

As specific examples of the aldehydes usable herein, may be mentioned formaldehyde, acetoaldehyde, benzaldehyde and terephthalaldehyde.

As specific examples of the ketones usable herein, may be mentioned acetone, methyl ethyl ketone, diethyl ketone and diphenyl ketone.

The condensation reactions of their corresponding compounds mentioned above can be separately performed in accordance with the conventional methods.

The vinylphenolic polymer is selected from a homopolymer of vinylphenol and copolymers of vinylphenol and a component copolymerizable therewith.

As specific examples of the copolymerizable component, may be mentioned acrylic acid, methacrylic acid, styrene, maleic anhydride, meleinimide, vinyl acetate, acrylonitrile and derivatives thereof.

The isopropenylphenolic polymer is selected from a homopolymer of isopropenylphenol and copolymers of isopropenylphenol and a component copolymerizable therewith.

As specific examples of the copolymerizable component, may be mentioned acrylic acid, methacrylic acid, styrene, maleic anhydride, meleinimide, vinyl acetate, acrylonitrile and derivatives thereof.

The hydrogenation reaction of the phenolic resin can be performed by a method known per se in the art and is achieved by dissolving the phenolic resin in an organic solvent and then introducing hydrogen into the solution in the present of a homogeneous or heterogeneous hydrogenation catalyst.

The concentration of the phenolic resin solution in the hydrogenation reaction is 1–70 wt. %, preferably 1–40 wt. %. No particular limitation is imposed on the solvent so long as it does not adversely affect the hydrogenation catalyst and dissolves the phenolic resin. No special limitation is imposed on the hydrogenation catalyst so long as it is a metallic or nonmetallic catalyst having activity in the hydrogenation reaction. As specific examples of the catalyst, may be mentioned hydrogenation catalysts of the Fe, Co, Ni, Ru, Rh, Pd, Ir, Os, Pt, Cr, Te, Mn, Ti, V, Zr, Mo and W types. These catalysts may be used either singly or in combination.

The reaction temperature in the hydrogenation reaction is generally 0°–300° C., preferably 20°–150° C. The reaction may be conducted at a temperature higher than 300° C. However, it is not preferred to perform the hydrogenation reaction at such a high temperature because side reaction tends to occur. The pressure of hydrogen is from an atmospheric pressure to 400 kg/cm$^2$, preferably from 5 to 200 kg/cm$^2$. After the hydrogenation reaction, the catalyst can be removed from the resin solution subjected to the hydrogenation reaction by reprecipitation, sedimentation, centrifugal separation, filtration or the like.

The hydrogenation is generally conducted so as to give a rate of hydrogenation in a range of 0.1–70%, preferably 1–50%, more preferably 3–40%. If the rate of hydrogenation should exceed 70%, the resulting hydrogenated phenolic resin will become insoluble in alkali. Such a highly-hydrogenated. phenolic resin is hence unsuitable for use as a base polymer for a resist. On the other hand, if the rate of hydrogenation should be too low, the performance-enhancing effect owing to the hydrogenation will become less.

These alkali-soluble phenolic resins may be used either singly or in combination.

For example, a copolymer of styrene and acrylic acid, methacrylic acid or maleic anhydride, a copolymer of an alkene and maleic anhydride, a polymer of vinyl alcohol, a polymer of vinylpyrrolidone, rosin, shellac and/or the like may be optionally added to the resist composition according to this invention in order to improve its developability, storage stability, heat resistance, etc.

The amount of these optional components to be added is 0–50 parts by weight, preferably 5–20 parts by weight per 100 parts by weight of the alkali-soluble phenolic resin.

(Halogen-containing aromatic compound)

In this invention, an aromatic compound which has at least one alkoxy group substituted with at least one halogen selected from chlorine and bromine (a halogenated alkoxy group), and is represented by any one of the general formulae (1) through (9), or a halogenated polyhydric phenolic compound represented by any one of the general formulae (10) through (16) is used as the compound which forms an acid upon exposure to active rays (also called "compound which is cleavable to form an acid"). These halogen-containing aromatic compounds may be used either singly or in combination.

Aromatic compound having halogenated alkoxy group(s)

The number of substituting halogen atoms per alkoxy group in the halogenated alkoxy group is at least one. Besides, the number of substituting halogenated alkoxy groups in the aromatic compound is at least one. Halogen used is at least one selected from chlorine or bromine. The halogenated alkoxy group is generally a chlorinated alkoxy group or a brominated alkoxy group. No particular limitation is imposed on the number of carbon atoms in the halogenated alkoxy group. However, the number is generally 1–10, preferably 3–5. The aromatic compound having at least one halogenated alkoxy group may have other substituent groups such as a hydroxyl group and a nitro group or contain a hetero atom.

The aromatic compound having at least one halogenated alkoxy group is preferably a compound obtained by converting a part or the whole of the hydroxyl group of an aromatic compound having at least one phenolic hydroxyl group into a halogenated ether group.

The specific structures of the aromatic compound having at least one halogenated alkoxy group are represented by the general formulae (1) through (9). The alkyl groups, alkoxy groups, alkenylene groups and arylene groups in the compounds represented by the general formulae (1) through (9) are preferably alkyl groups having 1–4 carbon atoms, alkoxy groups having 1–8 carbon atoms, alkenylene groups having 2–5 carbon atoms and arylene groups having 6–15 carbon atoms, respectively.

As specific examples of the aromatic compound having at least one halogenated alkoxy group, which is useful in the practice of this invention, may be mentioned compounds represented by the following chemical formulae.

As specific examples of the compounds represented by the general formula (1), may be mentioned the following compounds:

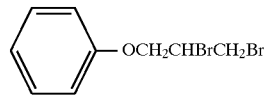

-continued

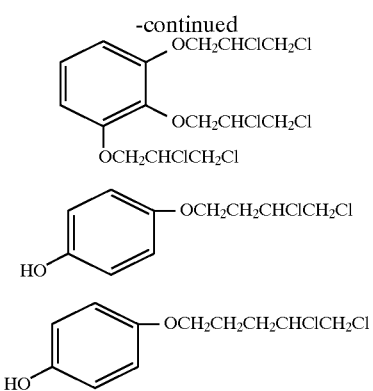
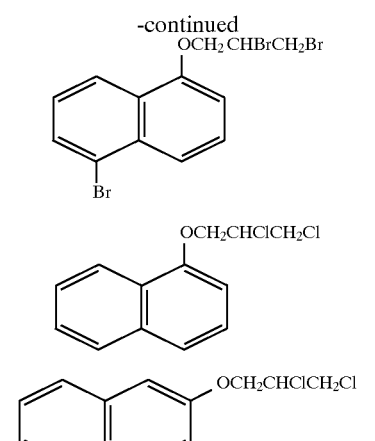
As specific examples of the compounds represented by the general formula (2), may be mentioned the following compounds:
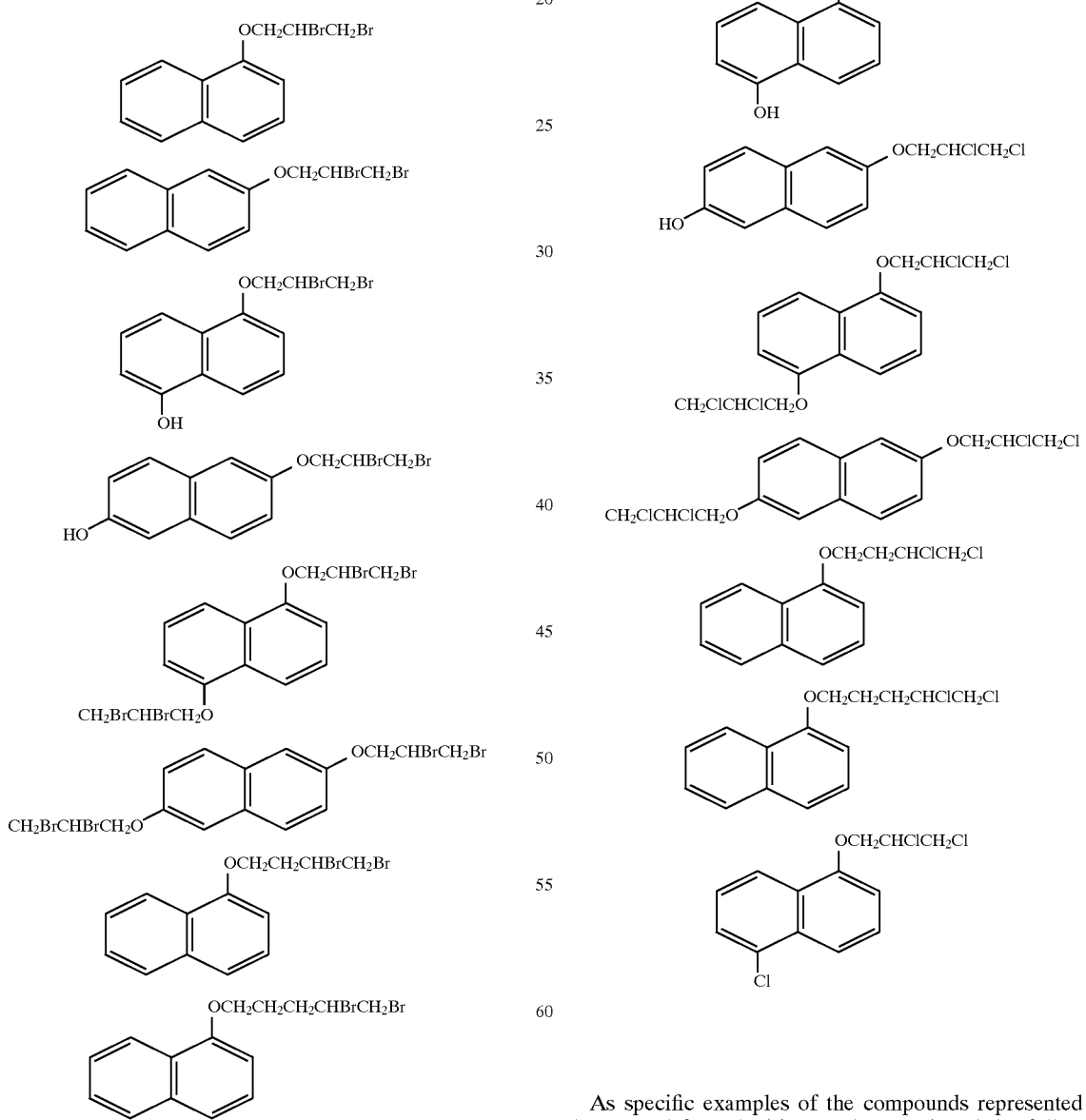
As specific examples of the compounds represented by the general formula (3), may be mentioned the following compounds:

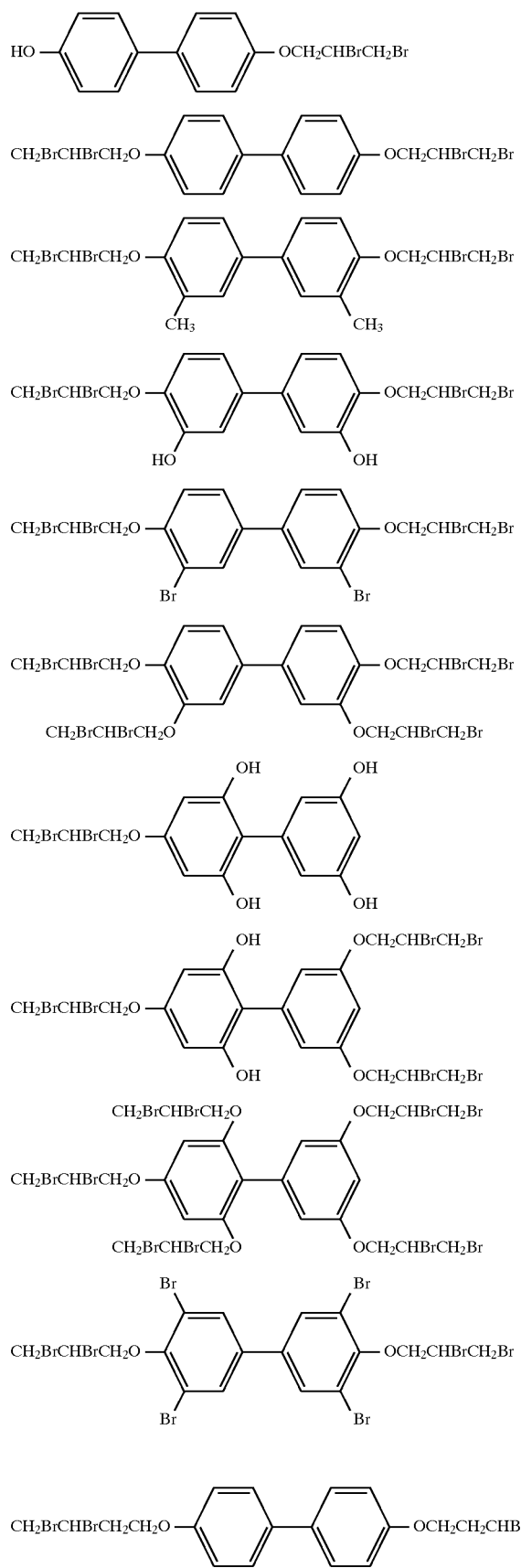

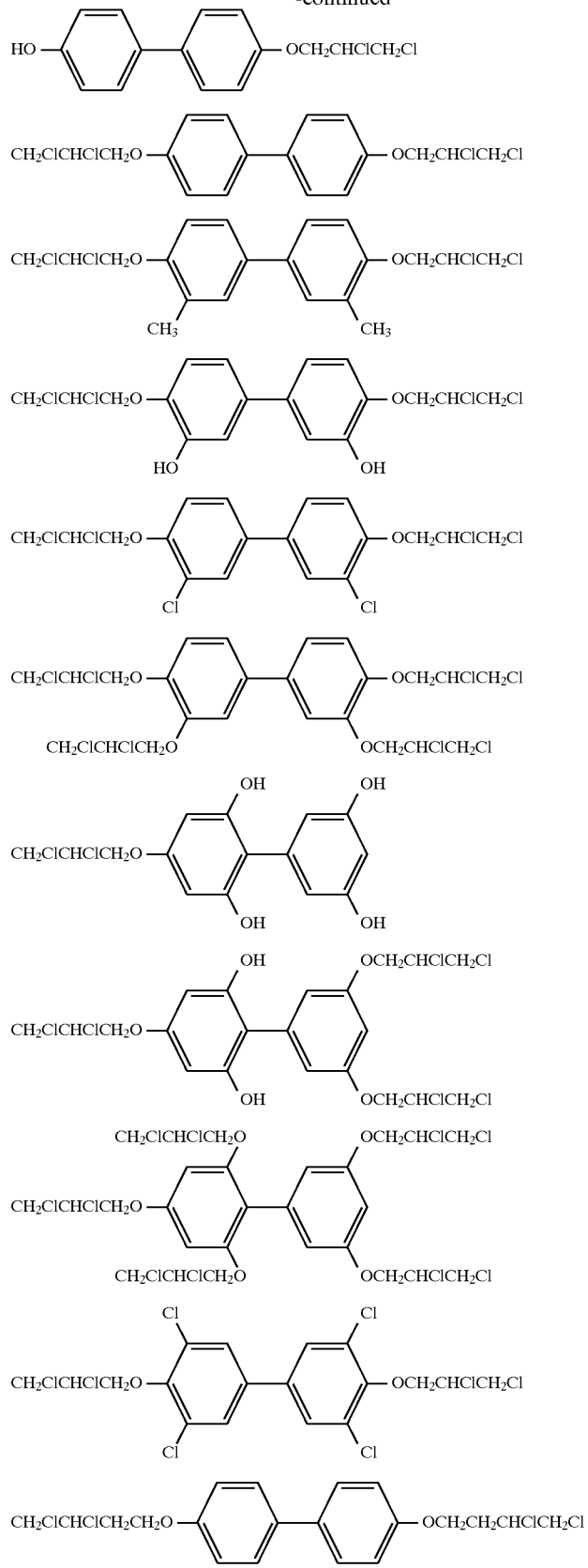

As specific examples of the compounds represented by the general formula (4), may be mentioned the following compounds:
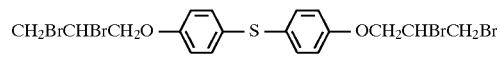
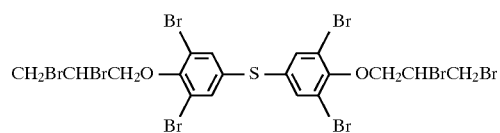
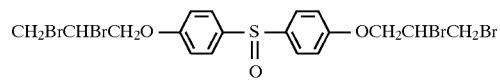
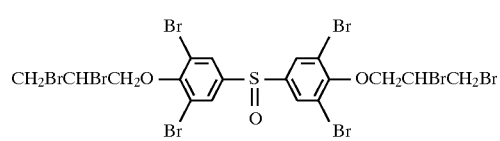
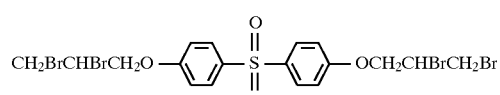
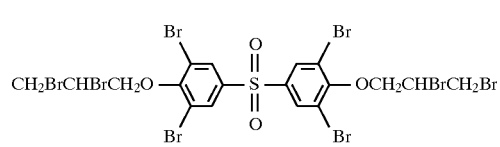
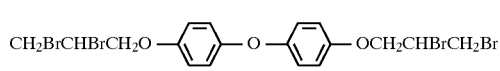
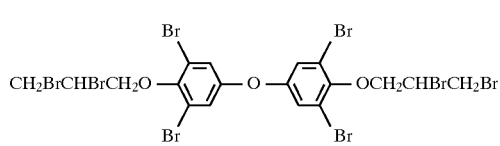
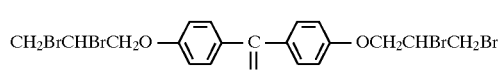
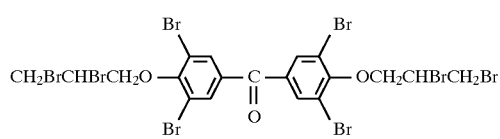
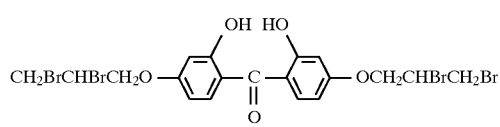
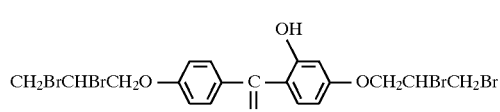
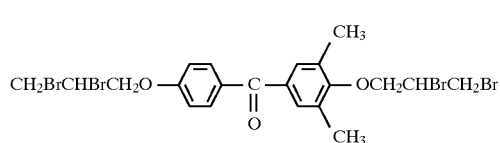
-continued
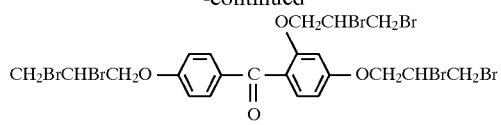
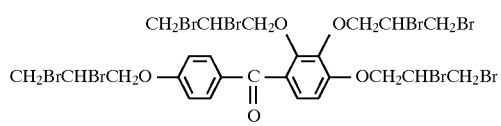
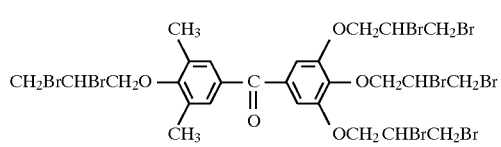
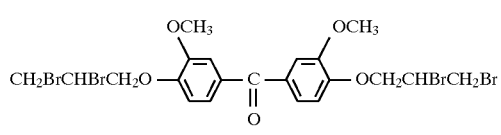
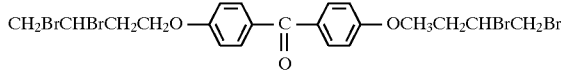
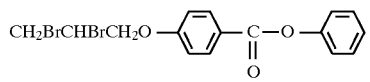
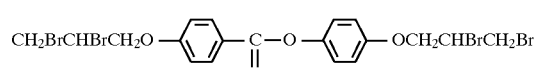
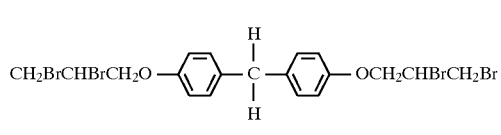
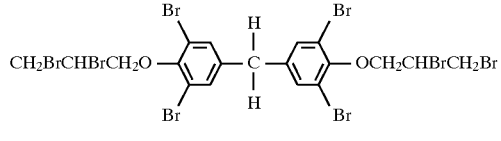
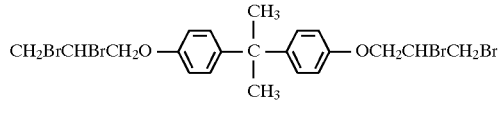
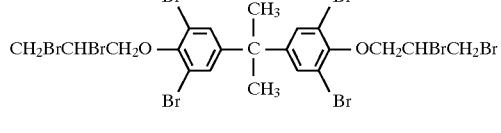
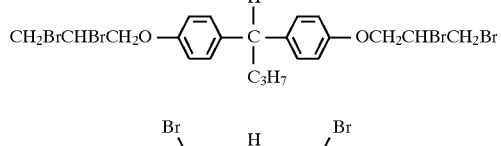
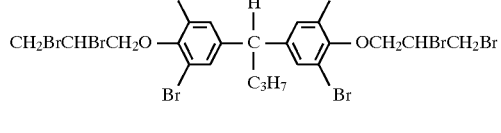

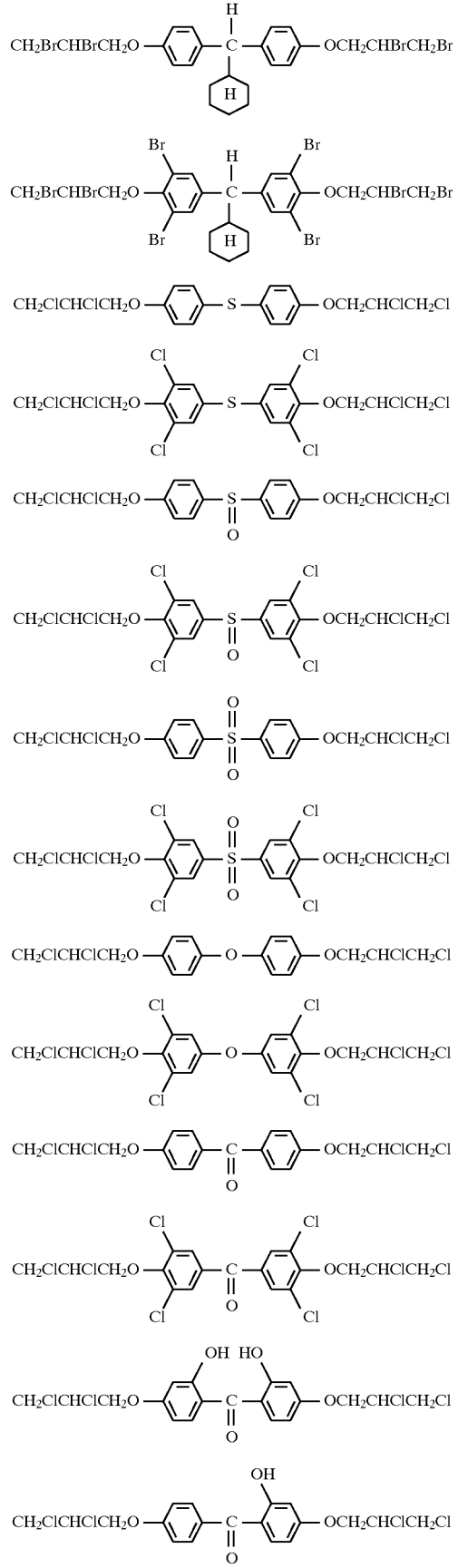
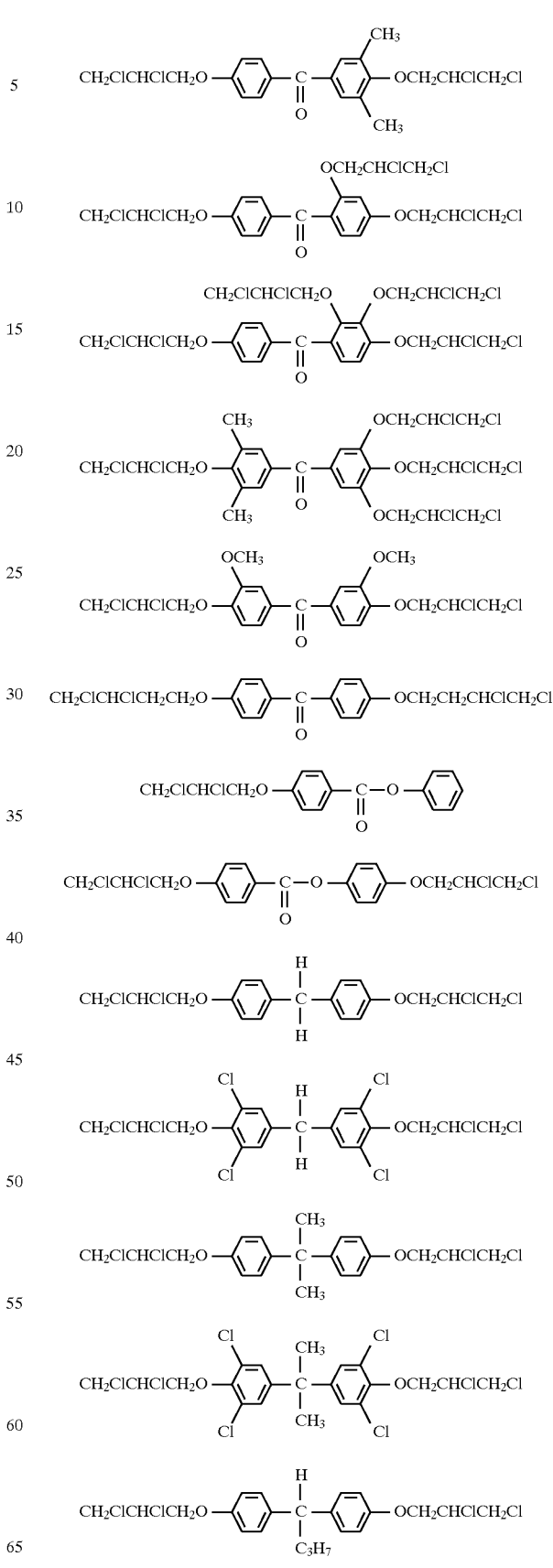

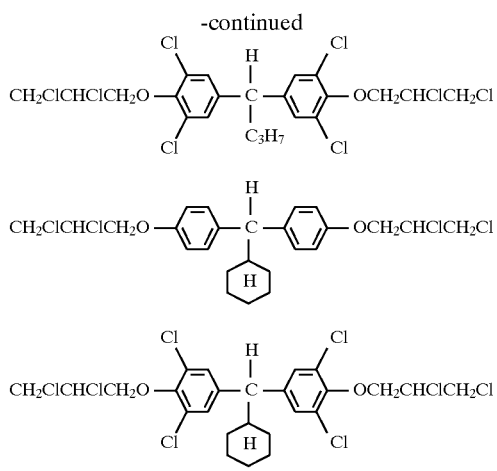
As specific examples of the compounds represented by the general formula (5), may be mentioned the following compounds:
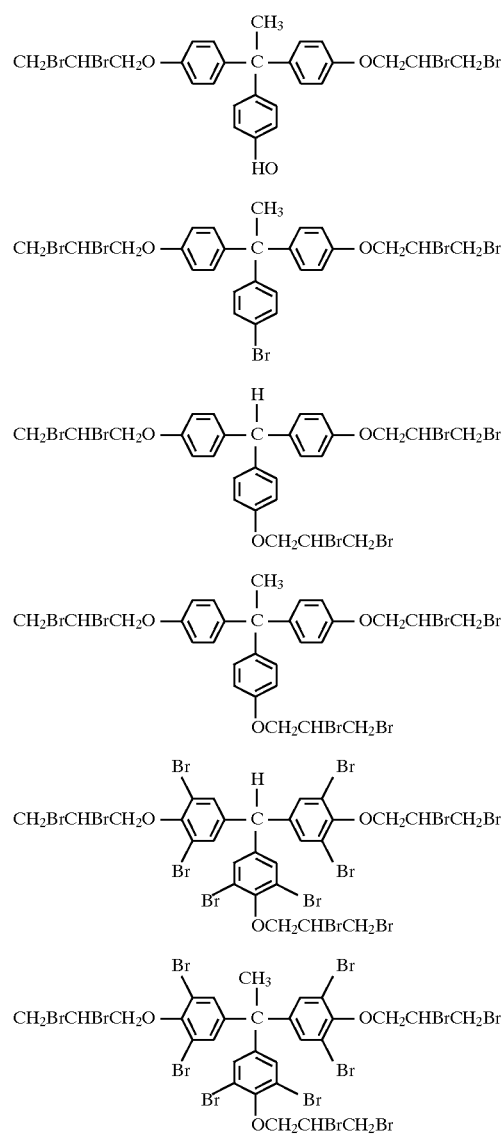
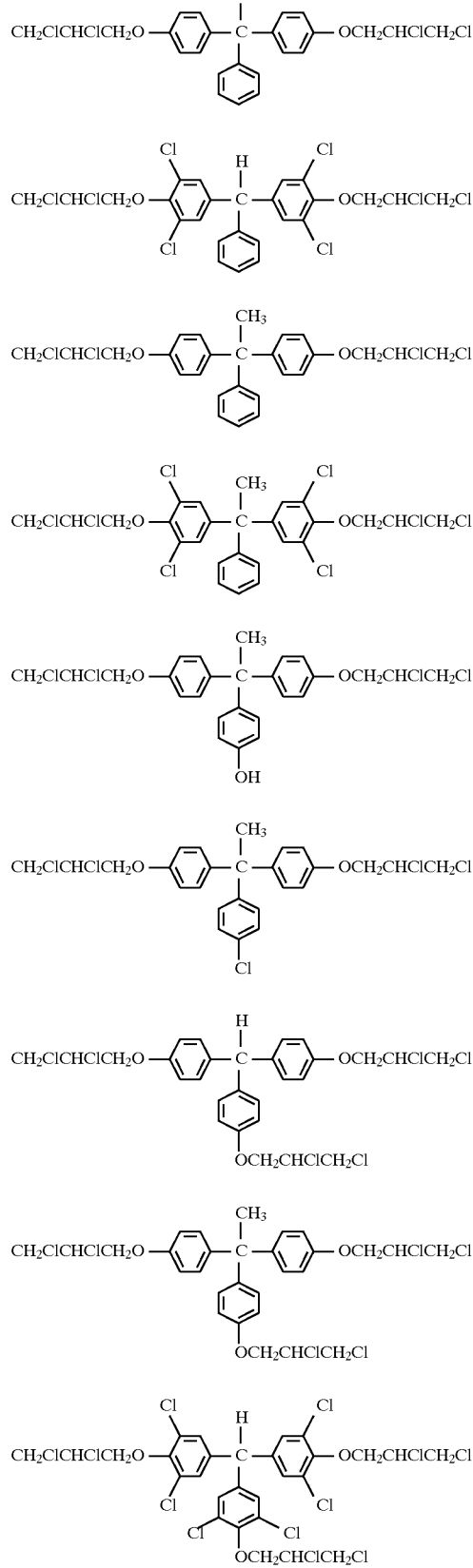

-continued
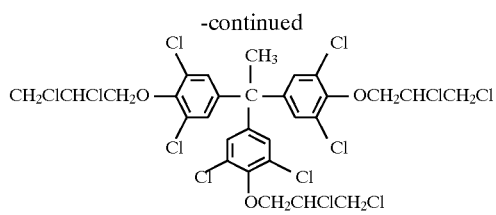
As specific examples of the compounds represented by the general formula (6), may be mentioned the following compounds:
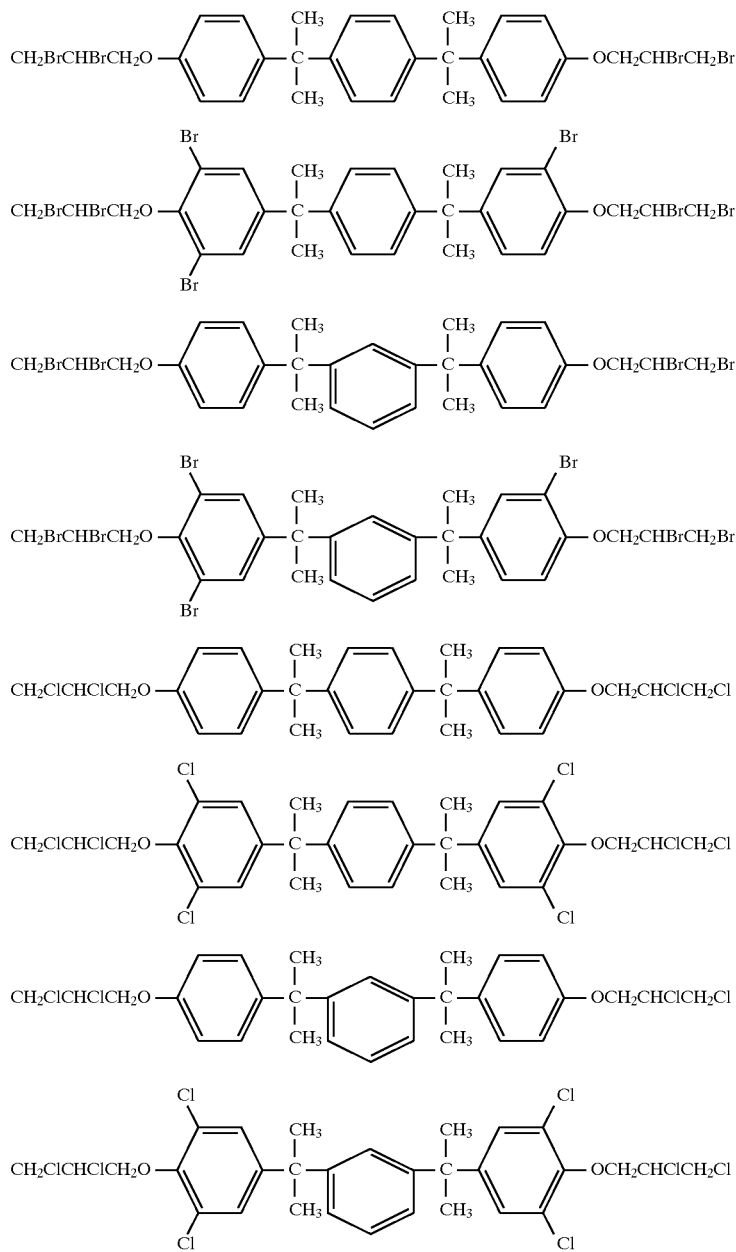
As specific examples of the compounds represented by the general formula (7), may be mentioned the following compounds:

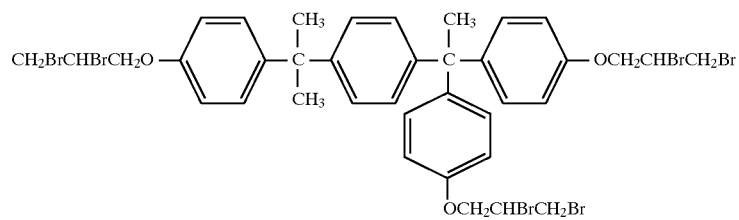
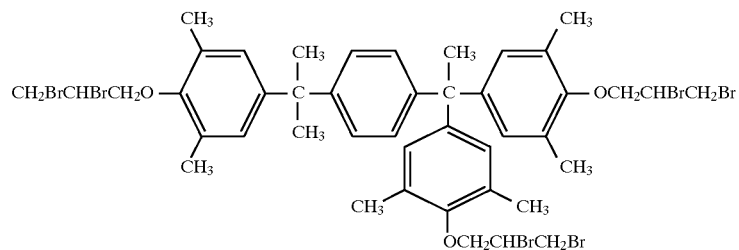
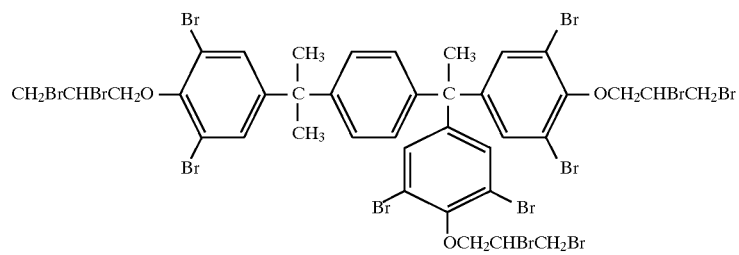
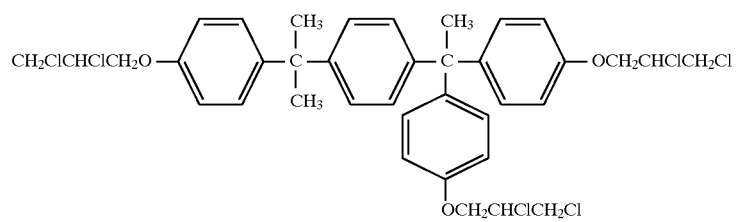
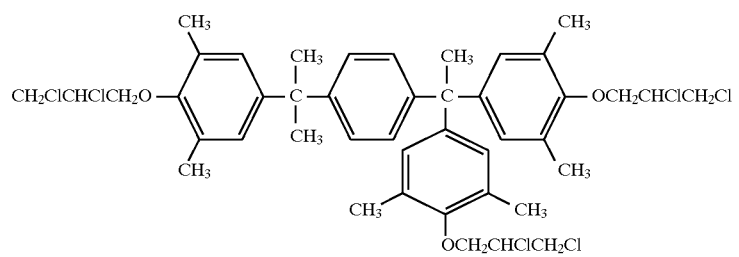
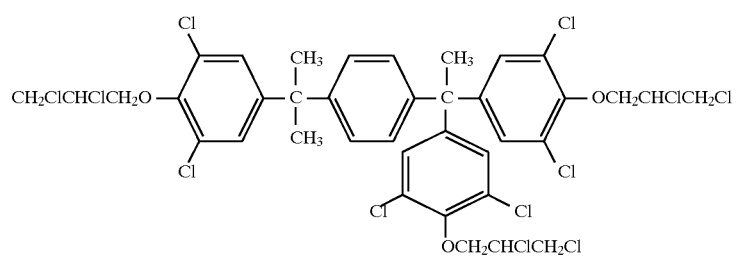
As specific examples of the compounds represented by the general formula (8), may be mentioned the following compounds:

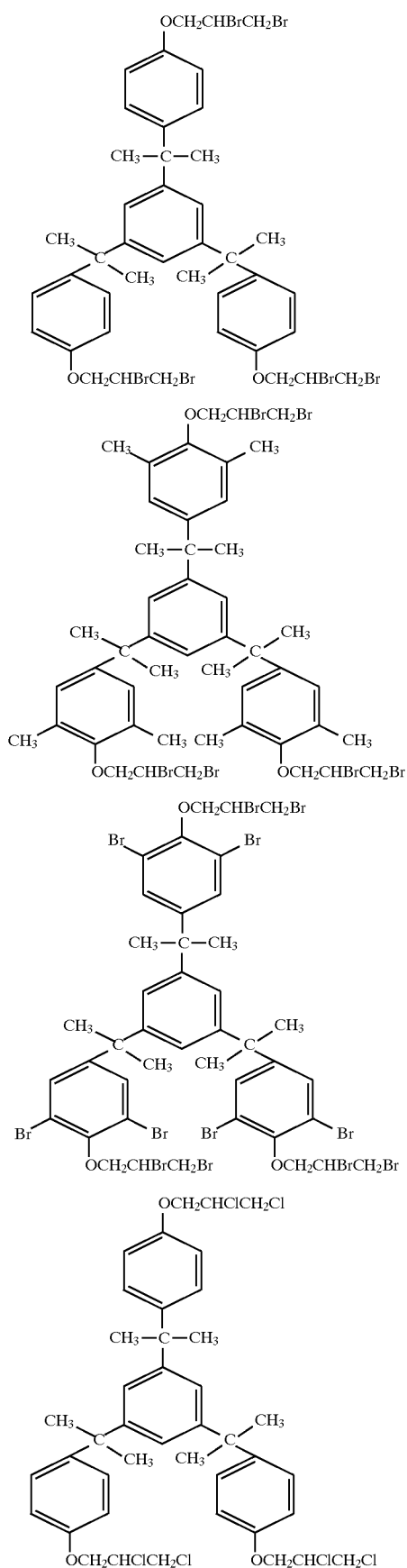
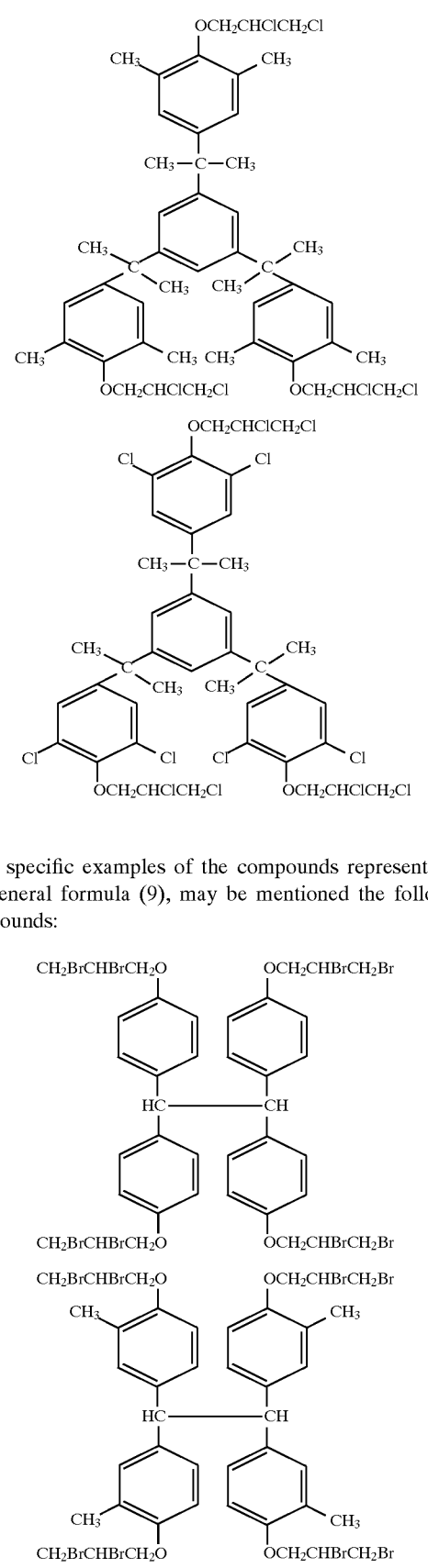
As specific examples of the compounds represented by the general formula (9), may be mentioned the following compounds:

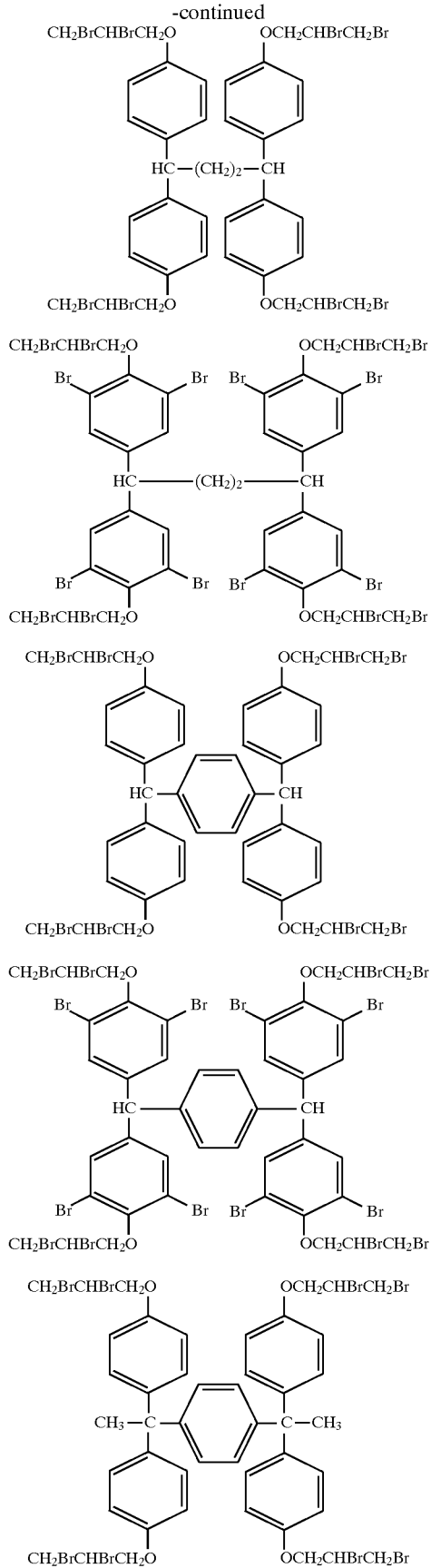
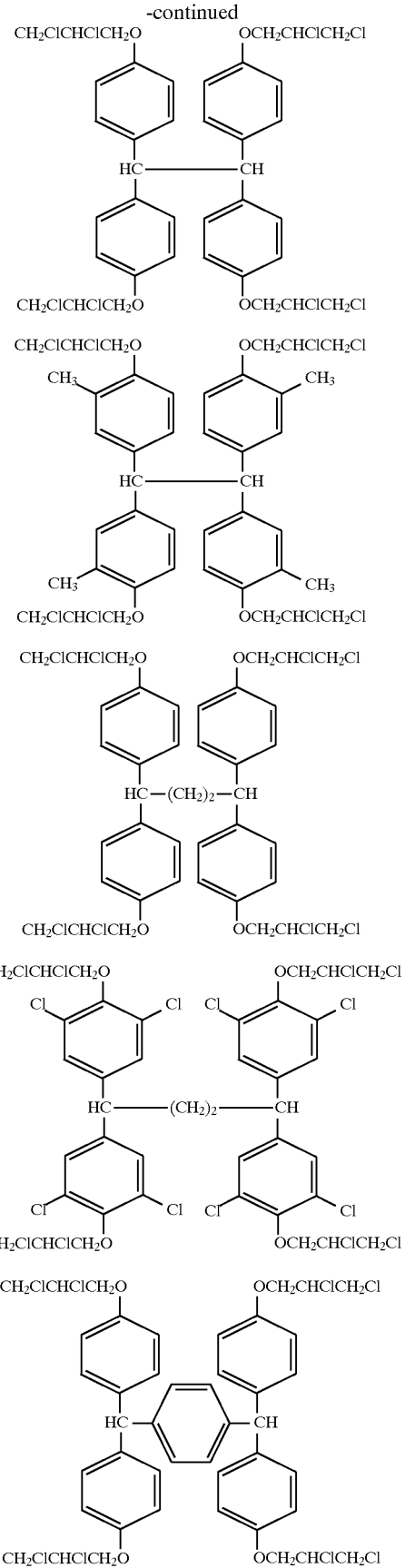

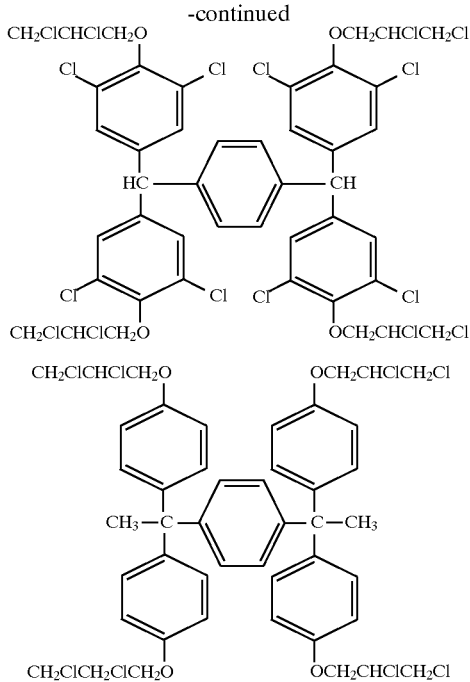

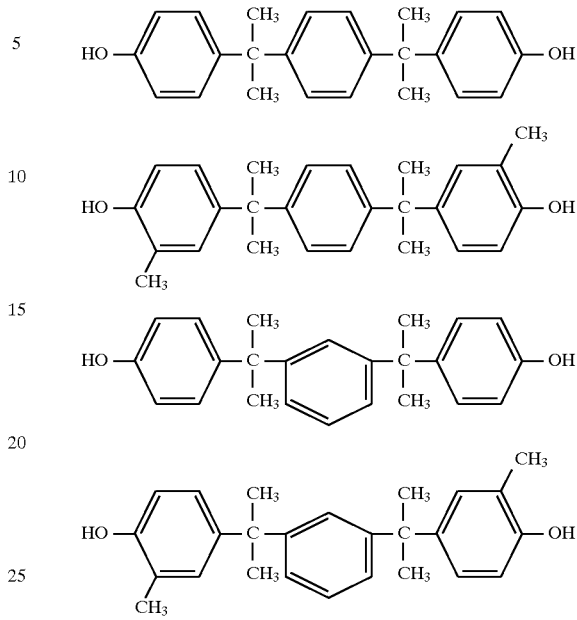

Halogen-containing polyhydric phenolic compound

The halogen-containing polyhydric phenolic compounds useful in the practice of this invention are compounds having at least one halogen atom bonded to an aromatic carbon atom and represented by the general formulae (10) through (16). In the halogen-containing polyhydric phenolic compounds represented by the general formulae (10) through (16), the alkyl groups, alkoxy groups, alkylene groups, alkenylene groups and arylene groups are preferably alkyl groups having 1–4 carbon atoms, alkoxy groups having 1–8 carbon atoms, alkylene groups having 1–6 carbon atoms, alkenylene groups having 2–5 carbon atoms and arylene groups having 6–15 carbon atoms, respectively. These groups may be substituted with an amino group, a nitro group and/or the like. Further, the halogen atom bonded to the aromatic carbon atom is preferably a chlorine atom or a bromine atom.

As synthesis processes of such halogen-containing polyhydric phenolic compounds, may be mentioned (i) a process in which a polyhydric phenolic compound is halogenated in accordance with a method known per se in the art and (ii) a process in which the synthesis is conducted by using a halogen-containing phenolic compound as a starting material. The former process is prevalent. Therefore, the specific examples of the polyhydric phenolic compound used as a starting material in the synthesis process (i) will hereinafter be described.

As exemplary starting materials for the halogen-containing polyhydric phenolic compounds represented by the general formula (10), may be mentioned the following compounds:

As exemplary starting materials for the halogen-containing polyhydric phenolic compounds represented by the general formula (11), may be mentioned the following compounds:

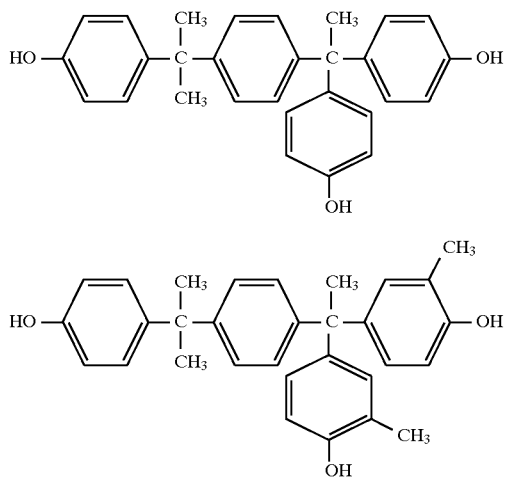

As exemplary starting materials for the halogen-containing polyhydric phenolic compounds represented by the general formula (12), may be mentioned the following compounds:

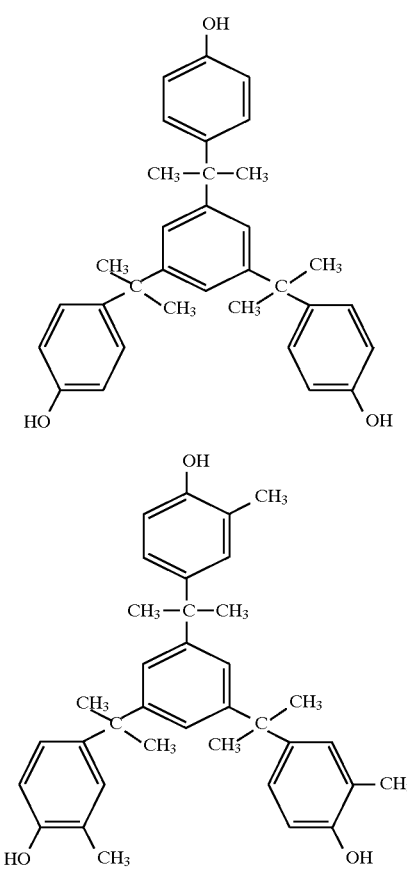
As exemplary starting materials for the halogen-containing polyhydric phenolic compounds represented by the general formula (13), may be mentioned the following compounds:
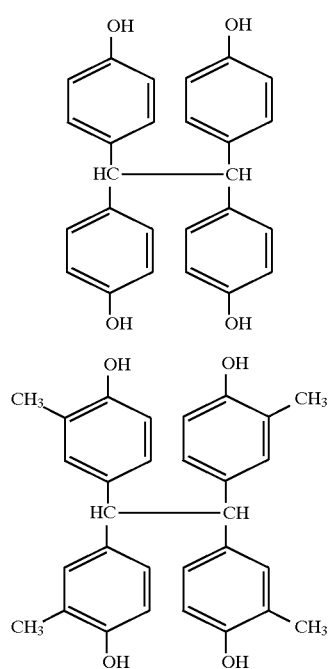
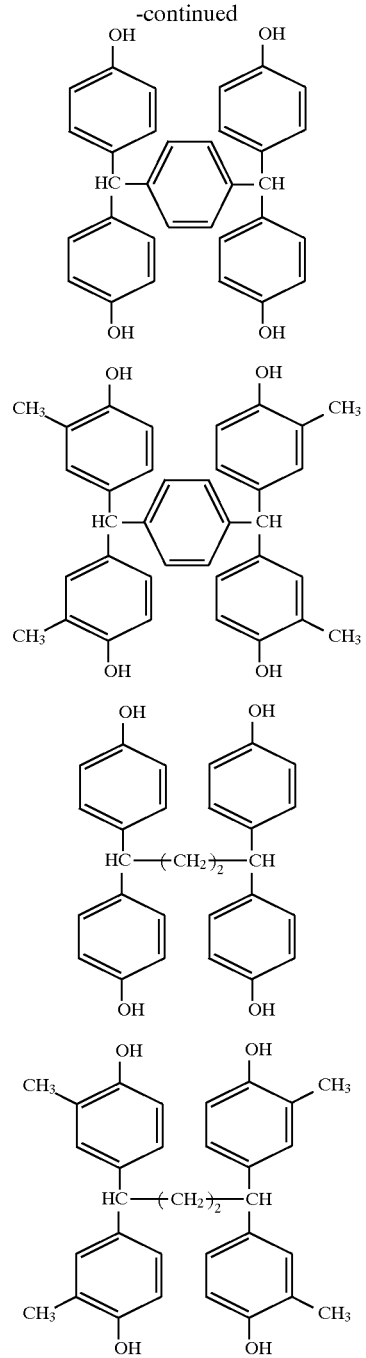
As exemplary starting materials for the halogen-containing polyhydric phenolic compounds represented by the general formula (14), may be mentioned the following compounds:
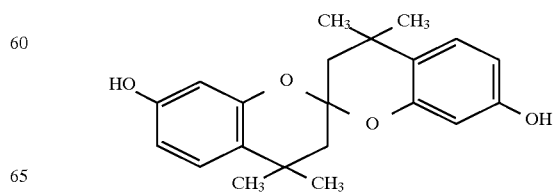

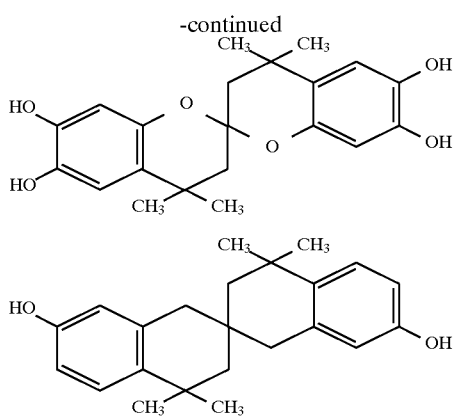

As exemplary starting materials for the halogen-containing polyhydric phenolic compounds represented by the general formula (15), may be mentioned the following compounds:

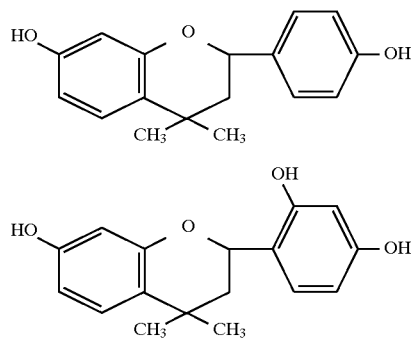

As exemplary starting materials for the halogen-containing polyhydric phenolic compounds represented by the general formula (16), may be mentioned the following compounds:

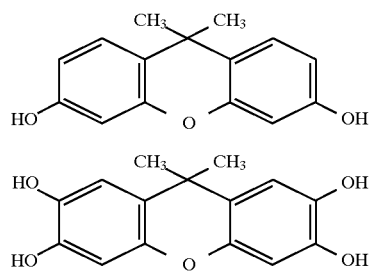

These halogen-containing aromatic compounds form a Lewis acid or Bronsted acid upon exposure to active rays.

The proportion of the halogen-containing aromatic compound as an acid-forming compound is generally 0.01–50 parts by weight, preferably 0.1–20 parts by weight per 100 parts by weight of the alkali-soluble phenolic resin. If the proportion should be lower than 0.01 part by weight, the formation of any patterns will become substantially impossible. On the other hand, if the proportion should exceed 50 parts by weight, the insolubilization of unexposed portions will tend to occur upon developing. The performance of the resulting resist composition will be lowered in either case.

(Acid-induced crosslinking compound)

No particular limitation is imposed on the compound which crosslinks the alkali-soluble phenolic resin in the presence of an acid (hereinafter abbreviated as "acid-induced crosslinking compound") useful in the practice of this invention so long as it crosslinks the alkali-soluble phenolic resin in the presence of an acid derived from the compound which forms the acid upon exposure to active rays to lower the solubility of the alkali-soluble phenolic resin portions, which have been exposed to the active rays, in an alkaline developer. In particular, compounds containing at least one C—O—R group, wherein R is a hydrogen atom or an alkyl group, or one epoxy group are preferred.

As specific examples of the compound containing at least one C—O—R group, may be mentioned melamine-formaldehyde resins, alkyletherified melamine resins, benzoguanamine resins, alkyletherified benzoguanamine resins, urea resins, alkyletherified urea resins, urethane-formaldehyde resins and alkylether group-containing phenolic compounds.

The melamine-formaldehyde resins can be obtained by condensing melamine and formaldehyde under basic conditions in accordance with a method known per se in the art. The alkyletherified melamine resins are obtained by alkyletherifying methylolmelamine, which has been obtained by condensing melamine and formaldehyde under basic conditions, with an alcohol. As the alkyletherified melamine resins used in this invention, melamine resins comprising, as a main component, hexaalkyletherified melamine are preferred because they have good storage stability. Among these, a hexamethyletherified melamine resin is particularly preferred.

Resins obtained by reacting formaldehyde with acetoguanamine or benzoguanamine, which is a melamine type compound, in place of melamine in the melamine-formaldehyde resins in the same manner as described above may also be used. The alkyletherified benzoguanamine resins can be synthesized with ease by using benzoguanamine instead of melamine in the alkyletherified melamine resins. As the alkyletherified benzoguanamine resins used in this invention, tetraalkyletherified benzoguanamine resins are preferred because they have good storage stability. Among these, a tetramethyletherified benzoguanamine resin is particularly preferred.

The urea resins are obtained by condensing urea and formaldehyde in accordance with a method known per se in the art. The alkyletherified urea resins are obtained by alkyletherifying methylolurea, which has been obtained by condensing urea and formaldehyde, with an alcohol. As the alkyletherified urea resins used in this invention, alkyletherified products of monomethylolurea, dimethylolurea, trimethylolurea and urone compounds are preferred, with the alkyletherified products of trimethylolurea being particularly preferred.

Resins obtained by reacting formaldehyde with glycoluryl, a urone compound, methylene urea, a cyclic urea compound such as propylene urea or the like, which is a ureic compound, in place of urea in the urea resins in the same manner as described above may also be used.

As the urethane-formaldehyde resins, may be mentioned compounds represented by the following general formula (17):

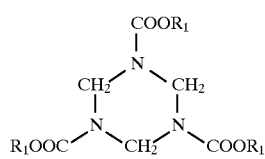

wherein $R_1$ means a hydrogen atom or an alkyl group.

As the alkylether group-containing phenolic compounds, may be mentioned compounds represented by the following general formula (18):

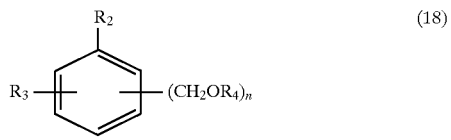

wherein $R_2$ means an alkyl, alkoxy, alkenyl or alkenyloxy group, $R_3$ denotes a hydrogen atom, an alkyl group or a hydroxyl group, $R_4$ is a hydrogen atom or an alkyl group, and n stands for an integer of 2–4.

As specific examples of the epoxy-containing compound, may be mentioned glycidyl ether epoxy resins such as bisphenol A epoxy, bisphenol F epoxy, bisphenol S epoxy, bisphenol E epoxy, novolak epoxy and brominated epoxy; alicyclic aliphatic epoxy resins containing cyclohexene oxide groups, tricyclodecene oxide groups, cyclopentene oxide groups or the like; glycidyl ester epoxy resins; glycidyl amine epoxy resins; heterocyclic epoxy resins; and polyfunctional epoxy resins. These epoxy resins can be synthesized in accordance with a method known per se in the art.

These acid-induced crosslinking compounds may be used either singly or in combination. The proportion of the acid-induced crosslinking compound is 0.2–50 parts by weight, preferably 3–40 parts by weight per 100 parts by weight of the alkali-soluble phenolic resin. If the proportion of the acid-induced crosslinking compound should be too low, the formation of any patterns will become substantially impossible. To the contrary, if the proportion should be too high, the insolubilization of unexposed portions will tend to occur upon developing.

(Resist composition)

The resist composition according to this invention is generally used in a state that it is dissolved in a solvent in order to apply it on a substrate to form a resist film.

As exemplary solvents, may be mentioned ketones such as acetone, methyl ethyl ketone, cyclohexanone, cyclopentanone, cycloheptanone and butyrolactone; alcohols such as n-propyl alcohol, isopropyl alcohol, n-butyl alcohol and t-butyl alcohol; ethers such as ethylene glycol dimethyl ether, ethylene glycol diethyl ether and dioxane; alcohol ethers such as ethylene glycol monomethyl ether, ethylene glycol monoethyl ether, propylene glycol monomethyl ether and propylene glycol monoethyl ether; esters such as propyl formate, butyl formate, propyl acetate, butyl acetate, methyl propionate, ethyl propionate, methyl butyrate and ethyl butyrate; mono-hydroxycarboxylates such as methyl 2-hydroxypropionate, ethyl 2-hydroxypropionate, methyl 2-methoxypropionate and ethyl 2-methoxypropionate; cellosolve esters such as cellosolve acetate, methylcellosolve acetate, ethylcellosolve acetate, propylcellosolve acetate and butyl-cellosolve acetate; propylene glycols such as propylene glycol, propylene glycol monomethyl ether, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether, diethylene glycol diethyl ether and diethylene glycol methyl ethyl ether; halogenated hydrocarbons such as trichloroethylene; aromatic hydrocarbons such as toluene and xylene; and polar solvents such as dimethylacetamide, dimethylformamide, N-methylacetamide and N-methylpyrrolidone. These solvents may be used either singly or in combination.

These solvents are used in an amount sufficient to uniformly dissolve the composition components used in the present invention.

In the resist composition of this invention, may be contained one or more of additives such as a surfactant, storage stabilizer, sensitizer, anti-striation agent, plasticizer and anti-halation agent, as needed.

An aqueous solution of an alkali is used as a developer for the resist composition of this invention. As specific examples of the alkali, may be mentioned inorganic alkalis such as sodium hydroxide, potassium hydroxide, sodium silicate and ammonia; primary amines such as ethylamine and propylamine; secondary amines such as diethylamine and dipropylamine; tertiary amines such as trimethylamine and triethylamine; alcohol amines such as diethylethanolamine and triethanolamine; and quaternary ammonium salts such as tetramethylammonium hydroxide, tetraethylammonium hydroxide, trimethylhydroxymethyl-ammonium hydroxide, triethylhydroxymethylammonium hydroxide and trimethylhydroxyethylammonium hydroxide.

If necessary, suitable amounts of a water-soluble organic solvent such as methanol, ethanol, propanol or ethylene glycol, a surfactant, a storage stabilizer, a dissolution inhibitor for the resin and/or the like may be added further to the aqueous alkali solution.

Using the resist composition of this invention, a resist film can be formed by applying its solution in a solvent on the surface of a substrate such as a silicon wafer by a method known per se in the art and then drying the solvent to remove it. As the coating method, spin coating can be recommended for use in particular.

The exposure of the resist composition can be conducted by exposing it to short-wavelength ultraviolet radiation or KrF excimer laser beam using a far ultraviolet-irradiating apparatus or an excimer laser in which krypton and fluorine gases are sealed, thereby forming a minute pattern.

A heat treatment (post-exposure bake) after the exposure can accelerate the reaction of the acid with the acid-induced crosslinking compound (acid-catalyzed reaction) to further enhance the sensitivity of the resist composition.

ADVANTAGES OF THE INVENTION

According to this invention, there can be provided a resist composition in which sensitivity, resolution, resistance to etching, storage stability and the like are well balanced. The resist composition according to this invention is a pattern-forming material suitable for use in lithography making use of short-wavelength radiation and is particularly suited for using as a negative resist for minute processing of semiconductor elements.

EMBODIMENTS OF THE INVENTION

The present invention will hereinafter be described more specifically by the following Examples and Comparative Example. Incidentally, all designations of "part" or "parts"

and "%" as will be used in the following examples mean part or parts by weight and wt. % unless expressly noted.

EXAMPLE 1

In 380 parts of ethyl 2-methoxypropionate, were dissolved 100 parts of polyvinylphenol (weight-average molecular weight: 5,000), 15 parts of an alkyletherified melamine-formaldehyde resin ("NIKALAC MW-30", product of Sanwa Chemical Co., Ltd.), 1.5 parts of a compound represented by the following chemical formula 1 and 0.01 part of a fluorine-containing surfactant. The resulting solution was filtered through a polytetrafluoroethylene filter (manufactured by Millipore Company) having a pore size of 0.1 μm to prepare a resist solution.

(Chemical formula 1)

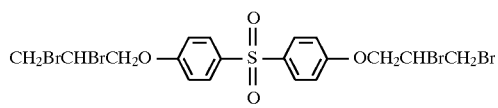

After applying the resist solution by a spinner on a silicon wafer, the resist solution was baked for 90 seconds at 90° C., thereby forming a resist film having a thickness of 1.0 μm. The thus-formed resist film on the wafer was exposed using a far ultraviolet-irradiating apparatus, "PLA-521FA" (manufactured by Canon Inc.) and a test mask. After post-exposure bake was then effected for 60 seconds at 130° C., the thus-baked film was developed by immersion developing in an aqueous solution of tetramethylammonium hydroxide (concentration: 2.38%) for 1 minute at 23° C., thereby obtaining a negative pattern.

The film thickness of the pattern was measured by a thickness meter, "Alpha Step 200" (manufactured by Tenko Company) and was found to be 0.95 μm. The wafer on which the pattern had been formed was taken out of the aqueous solution to observe it through an electron microscope. As a result, it was found that a pattern having a line width of 0.45 μm was resolved.

EXAMPLE 2

Using a dry etching apparatus, "DEM-451T" (manufactured by Nichiden Aneruba Company), a wafer on which a pattern had been formed in the same manner as in Example 1 was etched with a 30:10 mixed gas of $CF_4$ and $H_2$ at a power of 300 W, a pressure of 0.03 Torr and a frequency of 13.56 MHz. As a result, it was observed that portions of the wafer, on which no pattern had been formed, were only etched. The observation of the resist pattern after the etching showed that the pattern substantially maintained the form before the etching. It was understood from this that the resist composition according to Example 1 is excellent in resistance to dry etching.

EXAMPLE 3

In 380 parts of ethyl 2-methoxypropionate, were dissolved 100 parts of polyvinylphenol (weight-average molecular weight: 5,000), 15 parts of an alkyletherified melamine-formaldehyde resin ("NIKALAC MW-30", product of Sanwa Chemical Co., Ltd.), 1.0 part of a compound represented by the following chemical formula 2 and 0.01 part of a fluorine-containing surfactant. The resulting solution was filtered through a polytetrafluoroethylene filter having a pore size of 0.1 μm to prepare a resist solution.

(Chemical formula 2)

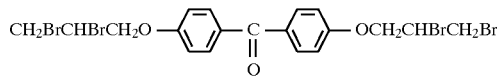

After applying the resist solution by a spinner on a silicon wafer, the resist solution was baked for 90 seconds at 85° C., thereby forming a resist film having a thickness of 1.0 μm. The thus-formed resist film on the wafer was exposed using a KrF excimer laser stepper, "NSR 1505EX" (manufactured by NICON CORP., NA=0.42) and a test mask. After post-exposure bake was then effected for 60 seconds at 125° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.45 μm was resolved.

EXAMPLE 4

In 350 parts of propylene glycol monomethyl ether acetate, were dissolved 100 parts of hydrogenated polyvinylphenol (rate of hydrogenation: 8%, weight-average molecular weight: 4,900), 25 parts of an alkylether group-containing phenolic compound (a methylolated product of "Methylon Resin 75108" produced by GENERAL ELECTRIC Co.), 0.5 part of a compound represented by the following chemical formula 3 and 0.01 part of a fluorine-containing surfactant. The resulting solution was filtered through a polytetra-fluoroethylene filter having a pore size of 0.1 μm to prepare a resist solution.

(Chemical formula 3)

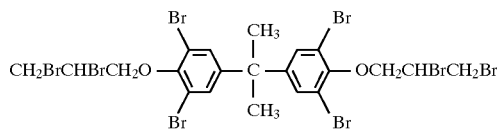

After applying the resist solution by a spinner on a silicon wafer, the resist solution was baked for 90 seconds at 90° C., thereby forming a resist film having a thickness of 1.0 μm. The thus-formed resist film on the wafer was exposed using the KrF excimer laser stepper, "NSR 1505EX" and a test mask. After post-exposure bake was then effected for 60 seconds at 130° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.35 μm was resolved.

EXAMPLE 5

In 350 parts of propylene glycol monomethyl ether acetate, were dissolved 100 parts of hydrogenated polyvinylphenol (rate of hydrogenation: 8%, weight-average molecular weight: 4,900), 25 parts of an alkyletherified urea-formaldehyde resin ("UFR-65", product of CYANAMIDE Co.), 1.0 part of a compound represented by the following chemical formula 4 and 0.01 part of a fluorine-containing surfactant. The resulting solution was filtered through a polytetrafluoroethylene filter having a pore size of 0.1 μm to prepare a resist solution.

(Chemical formula 4)

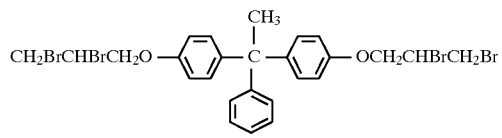

After applying the resist solution by a spinner on a silicon wafer, the resist solution was baked for 90 seconds at 90° C., thereby forming a resist film having a thickness of 1.0 μm. The thus-formed resist film on the wafer was exposed using the KrF excimer laser stepper, "NSR 1505EX" and a test mask. After post-exposure bake was then effected for 60 seconds at 130° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.35 μm was resolved.

EXAMPLE 6

In 330 parts of cyclohexanone, were dissolved 100 parts of hydrogenated polyvinylphenol (rate of hydrogenation: 8%, weight-average molecular weight: 4,900), 15 parts of an etherified urethane-formaldehyde resin, 2.0 parts of a compound represented by the following chemical formula 5 and 0.01 part of a fluorine-containing surfactant. The resulting solution was filtered through a polytetra-fluoroethylene filter having a pore size of 0.1 μm to prepare a resist solution.

(Chemical formula 5)

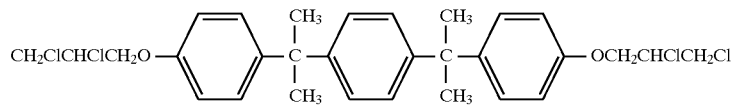

After applying the resist solution by a spinner on a silicon wafer, the resist solution was baked for 90 seconds at 90° C., thereby forming a resist film having a thickness of 0.8 μm. The thus-formed resist film on the wafer was exposed using the far ultraviolet-irradiating apparatus, "PLA-521FA" and a test mask. After post-exposure bake was then effected for 60 seconds at 130° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.50 μm was resolved.

EXAMPLE 7

In 380 parts of ethyl 2-methoxypropionate, were dissolved 100 parts of m-cresol novolak resin (weight-average molecular weight: 6,100), 20 parts of an alkyletherified urethane-formaldehyde resin, 2.0 parts of a compound represented by the following chemical formula 6 and 0.01 part of a fluorine-containing surfactant. The resulting solution was filtered through a polytetra-fluoroethylene filter having a pore size of 0.1 μm to prepare a resist solution.

(Chemical formula 6)

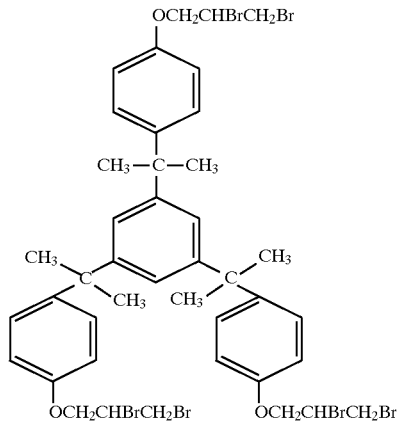

After applying the resist solution by a spinner on a silicon wafer, the resist solution was baked for 90 seconds at 90° C., thereby forming a resist film having a thickness of 0.8 μm. The thus-formed resist film on the wafer was exposed using the far ultraviolet-irradiating apparatus, "PLA-521FA" and a test mask. After post-exposure bake was then effected for 60 seconds at 125° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.50 μm was resolved.

EXAMPLE 8

In 330 parts of cyclohexanone, were dissolved 100 parts of m-cresol novolak resin (weight-average molecular weight: 6,100), 20 parts of an alkyletherified urea-formaldehyde resin ("UFR-65", product of CYANAMIDE Co.), 0.8 part of a compound represented by the following chemical formula 7 and 0.01 part of a fluorine-containing surfactant. The resulting solution was filtered through a polytetra-fluoroethylene filter having a pore size of 0.1 μm to prepare a resist solution.

(Chemical formula 7)

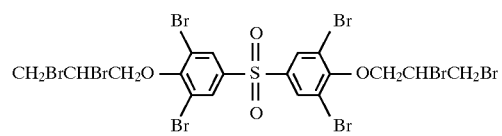

After applying the resist solution by a spinner on a silicon wafer, the resist solution was baked for 90 seconds at 90° C., thereby forming a resist film having a thickness of 1.2 μm. The thus-formed resist film on the wafer was exposed using the far ultraviolet-irradiating apparatus, "PLA-521FA" and a test mask. After post-exposure bake was then effected for 60 seconds at 125° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.45 μm was resolved.

EXAMPLE 9

In 380 parts of ethyl 2-methoxypropionate, were dissolved 100 parts of hydrogenated polyvinylphenol (rate of hydrogenation: 8%, weight-average molecular weight: 4,900), 15 parts of an alkyletherified melamine-formaldehyde resin ("NIKALAC MW-30", product of Sanwa Chemical Co., Ltd.), 1.0 part of a compound represented by the following chemical formula 8 and 0.01 part of a fluorine-containing surfactant. The resulting solution was filtered through a polytetra-fluoroethylene filter having a pore size of 0.1 μm to prepare a resist solution.

(Chemical formula 8)

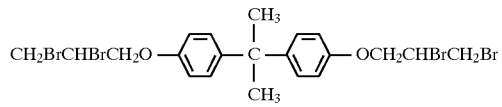

After applying the resist solution by a spinner on a silicon wafer, the resist solution was baked for 90 seconds at 90° C., thereby forming a resist film having a thickness of 0.8 μm. The thus-formed resist film on the wafer was exposed using the KrF excimer laser stepper, "NSR 1505EX" and a test mask. After post-exposure bake was then effected for 60 seconds at 130° C., the thus-baked film was developed by immersion developing in the aqueous solution of tetramethylammonium hydroxide for 1 minute at 23° C., thereby obtaining a negative pattern.

The sensitivity of the resist was evaluated and was found to be 5.0 mJ/cm$^2$.

The wafer on which the pattern had been formed was taken out of the aqueous solution to observe it through an electron microscope. As a result, it was found that a pattern having a line width of 0.30 μm was resolved.

COMPARATIVE EXAMPLE 1

A resist solution was prepared in the same manner as in Example 9 except that tetrabromobisphenol A used as an acid-forming compound in Japanese Patent Application Laid Open No. 52348/1990 was used in place of the compound represented by the chemical formula 8 in Example 9. A negative pattern was then obtained in the same manner as in Example 9.

The sensitivity of the resist was evaluated and was found to be 7.3 mJ/cm$^2$. This means that the resist in Comparative Example 1 was deteriorated in sensitivity to an extent as great as at least 30% compared with the resist in Example 9.

EXAMPLE 10

In 380 parts of ethyl 2-methoxypropionate, were dissolved 100 parts of polyvinylphenol (weight-average molecular weight: 5,000), 15 parts of an alkyletherified melamine-formaldehyde resin ("NIKALAC MW-30", product of Sanwa Chemical Co., Ltd.), 1.5 parts of a compound represented by the following chemical formula 9 and 0.01 part of a fluorine-containing surfactant. The resulting solution was filtered through a polytetrafluoroethylene filter having a pore size of 0.1 μm to prepare a resist solution.

(Chemical formula 9)

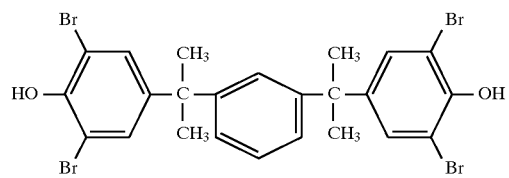

After applying the resist solution by a spinner on a silicon wafer, the resist solution was baked for 90 seconds at 90° C., thereby forming a resist film having a thickness of 1.0 μm. The thus-formed resist film on the wafer was exposed using a far ultraviolet-irradiating apparatus, "PLA-521FA" (manufactured by Canon Inc.) and a test mask. After post-exposure bake was then effected for 60 seconds at 130° C., the thus-baked film was developed by immersion developing in an aqueous solution of tetramethylammonium hydroxide (concentration: 2.38%) for 1 minute at 23° C., thereby obtaining a negative pattern.

The film thickness of the pattern was measured by a thickness meter, "Alpha Step 200" (manufactured by Tenko Company) and was found to be 0.95 μm. The wafer on which the pattern had been formed was taken out of the aqueous solution to observe it through an electron microscope. As a result, it was found that a pattern having a line width of 0.50 μm was resolved.

EXAMPLE 11

Using a dry etching apparatus ("DEM-451T", manufactured by Nichiden Aneruba Company), a wafer on which a pattern had been formed in the same manner as in Example 10 was etched with a 30:10 mixed gas of $CF_4$ and $H_2$ at a power of 300 W, a pressure of 0.03 Torr and a frequency of 13.56 MHz. As a result, it was observed that portions of the wafer, on which no pattern had been formed, were only etched. The observation of the resist pattern after the etching showed that the pattern substantially maintained the form before the etching.

It was understood from this that the resist composition according to Example 10 is excellent in resistance to dry etching.

EXAMPLE 12

In 375 parts of ethyl 2-methoxypropionate, were dissolved 100 parts of polyvinylphenol (weight-average molecular weight: 5,000), 15 parts of an alkyletherified melamine-formaldehyde resin ("NIKALAC MW-30", product of Sanwa Chemical Co., Ltd.), 1.5 parts of a compound represented by the following chemical formula 10 and 0.01 part of a fluorine-containing surfactant. The resulting solution was filtered through a polytetrafluoroethylene filter having a pore size of 0.1 μm to prepare a resist solution.

(Chemical formula 10)

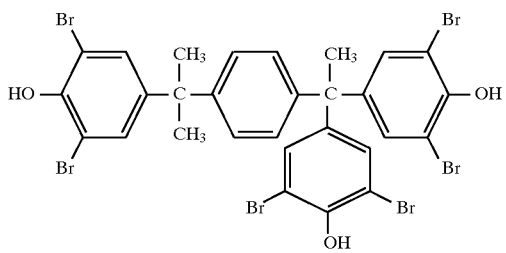

After applying the resist solution by a spinner on a silicon wafer, the resist solution was baked for 90 seconds at 85° C., thereby forming a resist film having a thickness of 1.0 μm. The thus-formed resist film on the wafer was exposed using a KrF excimer laser stepper, "NSR 1505EX" (manufactured by NICON CORP., NA=0.42) and a test mask. After post-exposure bake was then effected for 60 seconds at 125° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.45 μm was resolved.

EXAMPLE 13

In 350 parts of propylene glycol monomethyl ether acetate, were dissolved 100 parts of hydrogenated polyvinylphenol (rate of hydrogenation: 8%, weight-average molecular weight: 4,900), 25 parts of an alkylether group-containing phenolic compound (a methylolated product of "Methylon Resin 75108" produced by GENERAL ELECTRIC Co.), 2.5 parts of a compound represented by the following chemical formula 11 and 0.01 part of a fluorine-containing surfactant. The resulting solution was filtered through a polytetrafluoroethylene filter having a pore size of 0.1 μm to prepare a resist solution.

(Chemical formula 11)

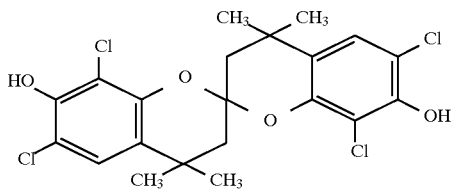

After applying the resist solution by a spinner on a silicon wafer, the resist solution was baked for 90 seconds at 90° C., thereby forming a resist film having a thickness of 1.0 μm. The thus-formed resist film on the wafer was exposed using the KrF excimer laser stepper, "NSR 1505EX" and a test mask. After post-exposure bake was then effected for 60 seconds at 150° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.40 μm was resolved.

EXAMPLE 14

In 350 parts of propylene glycol monomethyl ether acetate, were dissolved 100 parts of hydrogenated polyvinylphenol (rate of hydrogenation: 8%, weight-average molecular weight: 4,900), 20 parts of an alkyletherified urea-formaldehyde resin ("UFR-65", product of CYANAMID Co.), 1.5 parts of a compound represented by the following chemical formula 12 and 0.01 part of a fluorine-containing surfactant. The resulting solution was filtered through a polytetrafluoroethylene filter having a pore size of 0.1 μm to prepare a resist solution.

(Chemical formula 12)

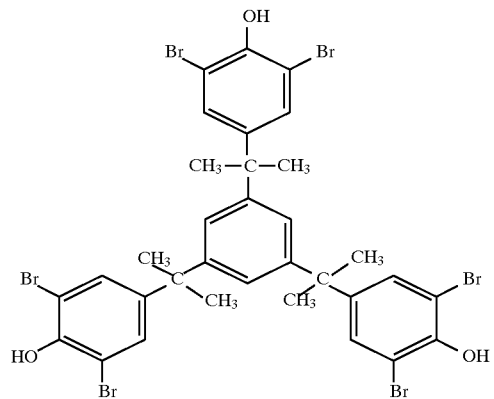

After applying the resist solution by a spinner on a silicon wafer, the resist solution was baked for 90 seconds at 90° C., thereby forming a resist film having a thickness of 1.0 μm. The thus-formed resist film on the wafer was exposed using the KrF excimer laser stepper, "NSR 1505EX" and a test mask. After post-exposure bake was then effected for 60 seconds at 130° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.45 μm was resolved.

EXAMPLE 15

In 330 parts of cyclohexanone, were dissolved 100 parts of hydrogenated polyvinylphenol (rate of hydrogenation: 8%, weight-average molecular weight: 4,900), 15 parts of an alkyletherified urethane-formaldehyde resin, 2.0 parts of a compound represented by the following chemical formula 13 and 0.01 part of a fluorine-containing surfactant. The resulting solution was filtered through a polytetrafluoroethylene filter having a pore size of 0.1 μm to prepare a resist solution.

(Chemical formula 13)

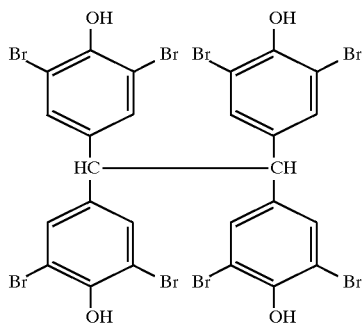

After applying the resist solution by a spinner on a silicon wafer, the resist solution was baked for 90 seconds at 90° C., thereby forming a resist film having a thickness of 0.8 µm. The thus-formed resist film on the wafer was exposed using the far ultraviolet-irradiating apparatus, "PLA-521FA" and a test mask. After post-exposure bake was then effected for 60 seconds at 130° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.50 µm was resolved.

EXAMPLE 16

In 380 parts of ethyl 2-methoxypropionate, were dissolved 100 parts of m-cresol novolak resin (weight-average molecular weight: 6,100), 20 parts of an alkyletherified urethane-formaldehyde resin, 2.0 parts of a compound represented by the following chemical formula 14 and 0.01 part of a fluorine-containing surfactant. The resulting solution was filtered through a polytetra-fluoroethylene filter having a pore size of 0.1 µm to prepare a resist solution.

(Chemical formula 14)

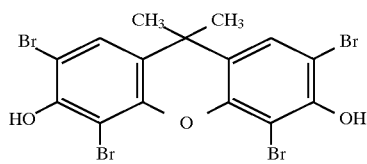

After applying the resist solution by a spinner on a silicon wafer, the resist solution was baked for 90 seconds at 90° C., thereby forming a resist film having a thickness of 0.8 µm. The thus-formed resist film on the wafer was exposed using the far ultraviolet-irradiating apparatus, "PIA-521FA" and a test mask. After post-exposure bake was then effected for 60 seconds at 125° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.50 µm was resolved.

EXAMPLE 17

In 330 parts of cyclohexanone, were dissolved 100 parts of m-cresol novolak resin (weight-average molecular weight: 6,100), 20 parts of an alkyletherified urea-formaldehyde resin ("UFR-65", product of CYANAMIDE Co.), 0.8 part of a compound represented by the following chemical formula 15 and 0.01 part of a fluorine-containing surfactant. The resulting solution was filtered through a polytetrafluoroethylene filter having a pore size of 0.1 µm to prepare a resist solution.

(Chemical formula 15)

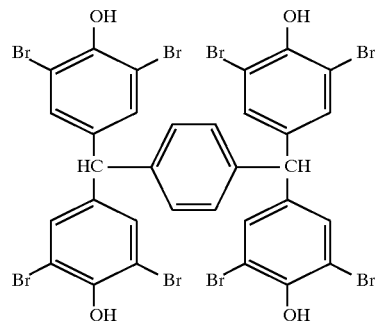

After applying the resist solution by a spinner on a silicon wafer, the resist solution was baked for 90 seconds at 90° C., thereby forming a resist film having a thickness of 0.8 µm. The thus-formed resist film on the wafer was exposed using the far ultraviolet-irradiating apparatus, "PLA-521FA" and a test mask. After post-exposure bake was then effected for 60 seconds at 125° C., the thus-baked film was developed by immersion developing in the aqueous solution of tetramethylammonium hydroxide for 1 minute at 23° C., thereby obtaining a negative pattern. The wafer on which the pattern had been formed was taken out of the aqueous solution to observe it through an electron microscope. As a result, it was found that a pattern having a line width of 0.35 µm was resolved.

EXAMPLE 18

In 380 parts of ethyl 2-methoxypropionate, were dissolved 100 parts of hydrogenated polyvinylphenol (rate of hydrogenation: 8%, weight-average molecular weight: 4,900), 15 parts of an alkyletherified melamine-formaldehyde resin ("NIKALAC MW-30", product of Sanwa Chemical Co., Ltd.), 1.0 part of a compound represented by the following chemical formula 16 and 0.01 part of a fluorine-containing surfactant. The resulting solution was filtered through a polytetrafluoroethylene filter having a pore size of 0.1 µm to prepare a resist solution.

(Chemical formula 16)

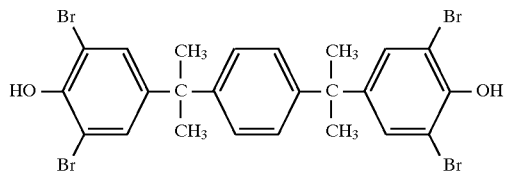

After applying the resist solution by a spinner on a silicon wafer, the resist solution was baked for 90 seconds at 90° C., thereby forming a resist film having a thickness of 0.8 µm. The thus-formed resist film on the wafer was exposed using the KrF excimer laser stepper, "NSR 1505EX" and a test mask. After post-exposure bake was then effected for 60

We claim:

1. A resist composition comprising in admixture:

(A) 100 parts by weight of an alkali-soluble phenolic resin;

(B) 0.2–50 parts by weight of a compound which forms an acid upon exposure to active rays and is represented by the following general formula (4):

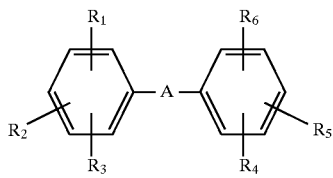
(4)

wherein $R_1$ is a halogenated alkoxy group with the proviso that the halogen atom is selected from chlorine and bromine atoms, $R_2$ through $R_6$ are independently selected from a hydrogen atom, halogen atoms, a hydroxyl group, alkyl groups, substituted alkyl groups, alkoxy groups and substituted alkoxy groups, and A denotes

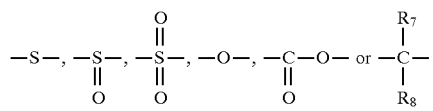

in which $R_7$ and $R_8$ are independently selected from a hydrogen atom, alkyl groups, cycloalkyl groups and alkenyl groups;

(C) 0.01–50 parts by weight of a compound which crosslinks the alkali-soluble phenolic resin in the presence of the acid formed from the compound (b); and (d) sufficient solvent to dissolve the foregoing composition components.

2. The resist composition according to claim 1, wherein the alkali-soluble phenolic resin is a hydrogenated alkali-soluble phenolic resin.

3. The resist composition according to claim 1, wherein the compound (c) is a compound containing at least one C—O—R group, wherein R is a hydrogen atom or an alkyl group, or one epoxy group.

4. The resist composition according to claim 1, which is suitable for use as a negative resist for minute processing of semiconductor elements.

5. The resist composition according to claim 4, wherein the minute processing comprises forming a pattern having a line width of 1 μm or less.

6. The resist composition according to claim 1, wherein the substituted alkoxy is a halogen substituted alkoxy.

7. The resist composition according to claim 6, wherein the halogen atom on the halogen substituted alkoxy group is bromine or chlorine.

* * * * *